(12) United States Patent
Hofmann et al.

(10) Patent No.: US 7,911,129 B2
(45) Date of Patent: Mar. 22, 2011

(54) ARRANGEMENT FOR AN ORGANIC PIN-TYPE LIGHT-EMITTING DIODE AND METHOD FOR MANUFACTURING

(75) Inventors: Michael Hofmann, Dresden (DE); Jan Birnstock, Dresden (DE); Jan Blochwitz-Nimoth, Dresden (DE); Ansgar Werner, Dresden (DE); Martin Pfeiffer, Dresden (DE); Kentaro Harada, Dresden (DE)

(73) Assignee: Novaled AG, Dresden (DE)

( * ) Notice: Subject to any disclaimer, the term of this patent is extended or adjusted under 35 U.S.C. 154(b) by 450 days.

(21) Appl. No.: 11/279,514

(22) Filed: Apr. 12, 2006

(65) Prior Publication Data
US 2006/0250076 A1 Nov. 9, 2006

(30) Foreign Application Priority Data
Apr. 13, 2005 (EP) .................................. 05008105

(51) Int. Cl.
*H05B 33/14* (2006.01)
*H01L 51/50* (2006.01)

(52) U.S. Cl. .......... 313/504; 313/503; 313/506; 445/24; 445/25; 428/690

(58) Field of Classification Search ........... 313/501–512
See application file for complete search history.

(56) References Cited

U.S. PATENT DOCUMENTS

| | | | |
|---|---|---|---|
| 4,356,429 | A | 10/1982 | Tang |
| 4,769,292 | A | 9/1988 | Tang et al. |
| 5,093,698 | A | 3/1992 | Egusa |
| 5,500,537 | A | 3/1996 | Tsumura et al. |

(Continued)

FOREIGN PATENT DOCUMENTS

CA 2549309 9/2005

(Continued)

OTHER PUBLICATIONS

C.W. Tang et al, Organic Electroluminescent Diodes, Applied Physics Letters, vol. 51, No. 12 Sep. 21, 1987 pp. 913-991.

(Continued)

*Primary Examiner* — Nimeshkumar D Patel
*Assistant Examiner* — Tracie Green
(74) *Attorney, Agent, or Firm* — Sutherland, Asbill & Brennan, LLP

(57) ABSTRACT

The invention relates to an arrangement for an organic pin-type light-emitting diode with an electrode and a counter-electrode and a stack with organic layers between the electrode and the counter-electrode, where the stack with the organic layers comprises an emission layer comprising a k (k=1, 2, 3, . . . ) organic matrix materials, a doped charge carrier transport layer, which is arranged between the electrode and the emission layer, a further doped charge carrier transport layer, which is arranged between the counter-electrode and the emission layer, and one block layer, which is arranged between one of the doped charge carrier transport layers and the emission layer. The organic layers of the stack are formed by means of n (n$\leq$k+2) organic matrix materials, where the n organic matrix materials comprise the k organic matrix materials of the emission layer. The stack with the organic layers can also be executed in a block-layer-free manner, where then the emission layer and the doped charge carrier transport layer are formed from an organic matrix material. Furthermore, a method for manufacturing such arrangements is stated.

21 Claims, 7 Drawing Sheets

U.S. PATENT DOCUMENTS

Figure 1:
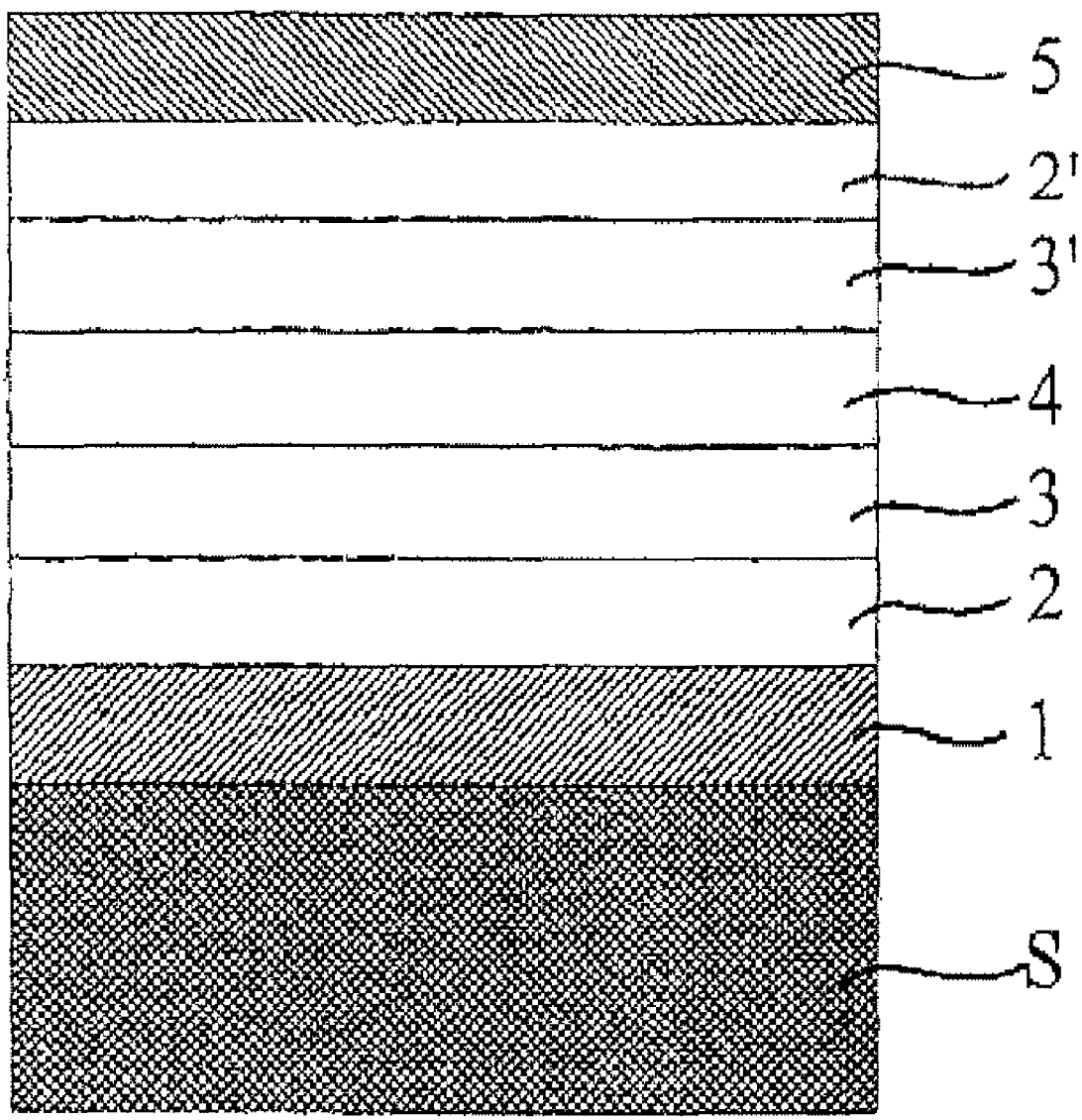

| | | | |
|---|---|---|---|
| 5,703,436 A | 12/1997 | Forrest et al. | |
| 5,757,026 A | 5/1998 | Forrest et al. | |
| 5,811,833 A | 9/1998 | Thompson | |
| 5,840,217 A | 11/1998 | Lupo et al. | |
| 5,917,280 A | 6/1999 | Burrows et al. | |
| 5,969,474 A | 10/1999 | Aria | |
| 5,989,785 A | 11/1999 | Ishihara et al. | |
| 6,023,073 A * | 2/2000 | Strite | 257/40 |
| 6,107,734 A | 8/2000 | Tanaka et al. | |
| 6,274,980 B1 | 8/2001 | Burrows et al. | |
| 6,303,238 B1 | 10/2001 | Thompson et al. | |
| 6,310,360 B1 | 10/2001 | Forrest et al. | |
| 6,337,492 B1 | 1/2002 | Jones et al. | |
| 6,406,804 B1 | 6/2002 | Higashi | |
| 6,437,769 B1 | 8/2002 | Kohayashi | |
| 6,555,840 B1 | 4/2003 | Hudson et al. | |
| 6,566,807 B1 * | 5/2003 | Fujita et al. | 313/506 |
| 6,573,651 B2 | 6/2003 | Adachi et al. | |
| 6,579,422 B1 | 6/2003 | Kasinuma | |
| 6,580,027 B2 | 6/2003 | Forrest et al. | |
| 6,589,673 B1 | 7/2003 | Kido et al. | |
| 6,645,645 B1 | 11/2003 | Adachi et al. | |
| 6,720,573 B2 | 4/2004 | Son | |
| 6,734,457 B2 | 5/2004 | Yamazaki | |
| 6,835,470 B1 | 12/2004 | Magain | |
| 6,867,538 B2 | 3/2005 | Adachi et al. | |
| 6,878,297 B1 | 4/2005 | Berger | |
| 6,897,473 B1 | 5/2005 | Burroughes et al. | |
| 6,900,588 B2 | 5/2005 | Adachi et al. | |
| 6,908,783 B1 | 6/2005 | Kuehl et al. | |
| 6,911,666 B2 | 6/2005 | Voutsas et al. | |
| 6,933,522 B2 | 8/2005 | Lin | |
| 6,936,961 B2 | 8/2005 | Liao et al. | |
| 6,965,197 B2 | 11/2005 | Tyan | |
| 6,979,414 B2 | 12/2005 | Hosokawa et al. | |
| 7,001,536 B2 | 2/2006 | Thompson et al. | |
| 7,074,500 B2 | 7/2006 | Pfeiffer et al. | |
| 7,161,292 B2 | 1/2007 | Leo | |
| 7,301,167 B2 | 11/2007 | Ko | |
| 7,473,410 B1 | 1/2009 | Huffman et al. | |
| 2001/0033136 A1 | 10/2001 | Kawase | |
| 2002/0030440 A1 | 3/2002 | Yamazaki | |
| 2002/0041975 A1 | 4/2002 | Ueda et al. | |
| 2002/0048688 A1 | 4/2002 | Fukuoka et al. | |
| 2002/0071082 A1 | 6/2002 | Okita et al. | |
| 2002/0084993 A1 | 7/2002 | Taneya | |
| 2002/0098379 A1 | 7/2002 | Arakane | |
| 2002/0109136 A1 | 8/2002 | Seo et al. | |
| 2003/0020073 A1 | 1/2003 | Long et al. | |
| 2003/0042848 A1 | 3/2003 | Park et al. | |
| 2003/0052616 A1 | 3/2003 | Antoniadis et al. | |
| 2003/0098946 A1 | 5/2003 | Blaessing et al. | |
| 2003/0127973 A1 | 7/2003 | Weaver et al. | |
| 2003/0146443 A1 | 8/2003 | Yamazaki et al. | |
| 2003/0170491 A1 | 9/2003 | Liao et al. | |
| 2003/0178619 A1 | 9/2003 | Forrest et al. | |
| 2003/0189401 A1 | 10/2003 | Kido et al. | |
| 2003/0230980 A1 | 12/2003 | Forrest et al. | |
| 2004/0012980 A1 | 1/2004 | Sugiura et al. | |
| 2004/0032220 A1 | 2/2004 | Cok et al. | |
| 2004/0062949 A1 | 4/2004 | Pfeiffer et al. | |
| 2004/0067324 A1 | 4/2004 | Lazarev et al. | |
| 2004/0104394 A1 | 6/2004 | Lin et al. | |
| 2004/0113547 A1 | 6/2004 | Son | |
| 2004/0119400 A1 | 6/2004 | Takahashi et al. | |
| 2004/0150330 A1 | 8/2004 | Suh et al. | |
| 2004/0183067 A1 | 9/2004 | Strip et al. | |
| 2004/0191952 A1 | 9/2004 | Shtein et al. | |
| 2004/0201018 A1 | 10/2004 | Yamahara et al. | |
| 2004/0214041 A1 | 10/2004 | Lu | |
| 2004/0227460 A1 | 11/2004 | Liao et al. | |
| 2004/0235209 A1 | 11/2004 | Hasegawa et al. | |
| 2004/0251816 A1 * | 12/2004 | Leo et al. | 313/504 |
| 2005/0029933 A1 | 2/2005 | Liao et al. | |
| 2005/0040390 A1 | 2/2005 | Pfeiffer et al. | |
| 2005/0040392 A1 | 2/2005 | Wu et al. | |
| 2005/0053801 A1 | 3/2005 | Eischner et al. | |
| 2005/0061232 A1 | 3/2005 | Werner et al. | |
| 2005/0073251 A1 | 4/2005 | Kato | |
| 2005/0086251 A1 | 4/2005 | Hatscher et al. | |
| 2005/0095736 A1 | 5/2005 | Padiyath et al. | |
| 2005/0110009 A1 | 5/2005 | Blochwitz-Nimoth et al. | |
| 2005/0118745 A1 | 6/2005 | Yamazaki et al. | |
| 2005/0173700 A1 | 8/2005 | Liao et al. | |
| 2005/0189875 A1 | 9/2005 | Nakada | |
| 2005/0218797 A1 | 10/2005 | Bechtel et al. | |
| 2005/0255334 A1 | 11/2005 | Kang et al. | |
| 2005/0269943 A1 | 12/2005 | Hack et al. | |
| 2005/0270279 A1 | 12/2005 | Giraldo et al. | |
| 2006/0033115 A1 | 2/2006 | Blochwitz et al. | |
| 2006/0038170 A1 | 2/2006 | Brunschwiler et al. | |
| 2006/0061266 A1 | 3/2006 | Kang et al. | |
| 2006/0065904 A1 | 3/2006 | Uemura et al. | |
| 2006/0145365 A1 | 7/2006 | Halls et al. | |
| 2006/0202196 A1 | 9/2006 | Kawakami et al. | |
| 2006/0231843 A1 | 10/2006 | Qin et al. | |
| 2006/0232992 A1 | 10/2006 | Bertram et al. | |
| 2006/0238112 A1 | 10/2006 | Kasama et al. | |
| 2006/0273310 A1 | 12/2006 | Birnstock et al. | |
| 2007/0034860 A1 | 2/2007 | Nakamura et al. | |
| 2007/0051946 A1 | 3/2007 | Walzer et al. | |
| 2007/0278479 A1 | 12/2007 | Werner et al. | |
| 2008/0143250 A1 | 6/2008 | Blochwitz-Nimoth et al. | |
| 2008/0164807 A1 | 7/2008 | Hofmann et al. | |
| 2008/0203406 A1 | 8/2008 | He et al. | |
| 2009/0009071 A1 | 1/2009 | Murano et al. | |
| 2009/0009072 A1 | 1/2009 | Wellmann et al. | |

FOREIGN PATENT DOCUMENTS

| | | |
|---|---|---|
| DE | 19916745 | 10/2000 |
| DE | 10058578 A1 | 6/2002 |
| DE | 10209789 | 9/2003 |
| DE | 10229231 | 1/2004 |
| EP | 1017118 A2 | 7/2000 |
| EP | 1030383 A2 | 8/2000 |
| EP | 1227466 | 7/2002 |
| EP | 1282101 | 2/2003 |
| EP | 1318499 | 6/2003 |
| EP | 1511094 A2 | 3/2005 |
| GB | 2361356 | 10/2001 |
| GB | 2388236 | 11/2003 |
| GB | 2390215 | 12/2003 |
| GB | 2392023 | 2/2004 |
| JP | 5931865 | 2/1984 |
| JP | 03208689 | 9/1991 |
| JP | 07-142169 | 11/1993 |
| JP | 05-034692 | 12/1993 |
| JP | 11283750 | 10/1999 |
| JP | 2000-231992 | 8/2000 |
| JP | 2003203769 | 7/2003 |
| JP | 2003297561 | 10/2003 |
| JP | 2004119197 | 4/2004 |
| JP | 2004214120 | 7/2004 |
| JP | 2004234942 | 8/2004 |
| JP | 2005156925 | 6/2005 |
| KR | 0522687 | 10/2005 |
| TW | 200401017 | 1/2004 |
| WO | WO 99/48160 | 9/1999 |
| WO | WO 01/27910 | 4/2001 |
| WO | WO 02/37580 | 5/2002 |
| WO | WO 02/093664 | 11/2002 |
| WO | WO 03/069958 | 8/2003 |
| WO | WO 03/088271 | 10/2003 |
| WO | WO 2004/025615 | 3/2004 |
| WO | WO 2004/059606 | 7/2004 |
| WO | WO 2004/097954 | 11/2004 |
| WO | WO 2005/008801 | 1/2005 |
| WO | WO 2005/089288 | 9/2005 |

OTHER PUBLICATIONS

Gufeng He et al, High-efficiency and Low-voltage p-i-n Electrophosphorescent Organic Light-emitting Diodes with Double-emission Layers, Applied Physics Letters, vol. 85, No. 17, Oct. 25, 2004, pp. 3911-3913.

Junji Kido, Recent Progress in Organic Light-emitting Devices, Proceedings of the 1st International Display Manufacturing Conference IDMC 2000, Seoul Korea, Sep. 5, 2000, pp. 399-400.

Marc Baldo et al, Organic Vapor Phase Deposition, Advanced Materials, 1998, 10, No. 18, pp. 1505-1514.

M. Pfeiffer et al, Controlled Doping of Phthalocyanine Layers by Cosublimation with Acceptor Molecules: A Systemic Seebeck and Conductivity Study, Applied Physics Letters, vol. 73, No. 22, Nov. 30, 1998, pp. 3202-3204.

Martin Pfeiffer et al, Electrophosphorescent p-i-n Organic Light-emitting Devices for Very-high-efficiency Flat-panel Displays, Advanced Materials, 14, No. 22, Nov. 18, 2002, pp. 1633-1636.

X. Zhou et al, Low-voltage Inverted Transparent Vacuum Deposited Organic Light-emitting Diodes using Electrical Doping, Applied Physics Letters, vol. 81, No. 2, Jul. 29, 2002, pp. 922-924.

Brian W. D'Andrade, Operational Stability of Electrophosphorescent Devices Containing p and n Doped Transport Layers, Applied Physics Letters, vol. 83, No. 19, Nov. 10, 2003, pp. 3858-3860.

Jinsong Huang et al , Low-voltage Organic Electroluminescent Devices Using pin Structures, Applied Physics Letters, vol. 80, No. 1, Jan. 7, 2002, pp. 139-141.

Jun Endo et al, Organic Electroluminescent Devices with a Vacuum-deposited Lewis-acid-doped Hole-Injecting Layer, Applied Physics Letters, vol. 41, Mar. 15, 2002, pp. 358-360.

Adachi, C. et al., "Efficient electrophosphorescence using a doped ambipolar conductive molecular organic thin film," Organic Electronics 2, (2001), pp. 37-43.

Adachi, C. et al., "High-efficiency organic electrophosphorescent devices with tris (2-phenylpyridine) iridium doped into electron-transporting materials," App. Phys. Lett. vol. 77, No. 6, Aug. 7, 2000.

Adachi, C. et al., "Nearly 100% internal phosphorescence efficiency in an organic light emitting device," Journal of Applied Physics (2001), vol. 90:10, pp. 5048-5051.

Adachi, et al. "Electroluminescence in Organic Films with Three-Layer Structure," Japanese Journal of Applied Physics, 27, L269 (1988).

Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).

Ammermann, D. et al., "Photonic devices based on crystalline organic semiconductors for optoelectronic integrated circuits," Jps. J. Appl. Phys. Pt. 1 (1995) vol. 34, pp. 1293-1297.

Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.

Baldo, et al. "Highly efficient phosphorescent emission from organic electroluminescent devices," Nature, vol. 395, Sep. 10, 1998, pp. 151-154.

Baldo, M. A. et al., "High efficiency fluorescent organic light-emitting devices using a phosphorescent sensitizer," Nature, (2000), vol. 403, pp. 750-753.

Baldo, M. A. et al., "Transient analysis of organic electrophosphorescence: I. Transient analysis of triplet energy transfer," Physical Review B, (2000), vol. 62:16, pp. 10958-10966.

Baldo, M. A. et al., "Very high-efficiency green organic light-emitting devices based on electrophosphorescence," Applied Physics Letters, (1999), vol. 75:1, pp. 4-6.

Baldo, M. A., et al., "Transient analysis of organic electrophosphorescence II. Transient analysis of triplet-triplet annihilation," Physical Review B, (2000), vol. 62:16, pp. 10967-10977.

Bandyopadhyay, A, et al. "Large conductance switching and memory effects in organic molecules for data-storage applications," Appl. Phys. Lett. 82, 1215 (2003).

Bard, A. J., Faulkner, R.J., Electrochemical Methods: Fundamentals and Applications, Wiley, 2nd Ed., 2000 (Chapter 2).

Bard, A. J., Faulkner, R.J., Electrochemical Methods: Fundamentals and Applications, Wiley, 2nd Ed., 2000 (Chapter 6).

Bastard, G., "Wave mechanics applied to semiconductor heterostructures," The Editions of Physique, (1988) pp. 64-67.

Baumgartel, H. et al. "Intracluster Electron and Proton Transfer in Ionic Ortho-Xylene/Dimethylamine Aggregates," Ber Bunsenges. Phys. Chem. 101, 783-788 (1997) No. 5.

Baumgartel, H. et al., "Polarographische Untersuchungen zur Konformation von 1.2.3.4.5-pentaarylimidazoliumkationen," Ber. Bunsenges (1972) 76/2, 94-100.

Bernanose, Andre et al. "Sur un nouvea mode d'emission lumineuse chez certains composes organiques," J. de Chimie Physique, 1953, No. 1, pp. 64-68.

Birnstock, J. et al., "High Efficiency Top Emitting OLEDs on a-Si Active Matrix Backplanes with Large Aperture Ratio," OLED1: Panel, IDW '04, Dec. 8, 2004.

Blochwitz, J. "Organic Light-Emitting Diodes with Doped Charge Transport Layers" Dissertation: Technische Universitat Dresden (2001). http://deposit.ddb.de/cgi-bin/dokserv?idn=963580051&dok_var=d1&dok_ext=pdf&filename=963580051.pdf.

Blochwitz, J. et al., "Interface electronic structure of organic semiconductors with controlled doping levels," Org. Electronics 2, 97 (2001).

Blochwitz, J., et al., "Low voltage organic light emitting diodes featuring doped phthalocyanine as hole transport material," Applied Physics Letters, vol. 73, No. 6, Aug. 10, 1998, pp. 729-731.

Blochwitz, J., et al., "Non-polymeric OLEDs with a doped amorphous hole transport layer and operating voltages down to 3.2 V to achieve 100 cd/m$^2$," Synthetic Metals, (2002), vol. 127, pp. 169-173.

Bloom, C. J. et al., "Low work function reduced metal complexes as cathodes in organic electroluminescent devices," J. of Phyiscal Chemistry B, vol. 107, No. 13, pp. 2933-2938.

Campbell, A. J. et al., "Dispersive electron transport in an electroluminescent polyfluorene copolymer measured by the current integration time of flight method," Applied Physics Letters, Oct. 1, 2001, vol. 79, No. 14 pp. 2133-2135.

Carter, S. A. et al., "Enhanced luminance in polymer composite light emitting devices," Appl. Phys. Lett., vol. 71, pp. 1145-1147, Sep. 1997.

Chung-Chih, Wu et al., "Efficient organic blue-light-emitting devices with double confinement on terfluorenes with ambipolar carrier transport properties," Advanced Materials, Jan. 5, 2004, vol. 16, No. 1, pp. 61-65.

Colle, M. et al. "Switching and filamentary conduction in non-volatile organic memories," Organic Electronics, 7, 305-312 (Oct. 2006).

Connelly, N. G. et al., "Chemical Redox Agents for Organometallic Chemistry," Chem. Rev., 96, 877 (1996).

Cotton, F. et al., "Closed-shell molecules that ionize more readily than cesium," Science, vol. 298, No. 5600, pp. 1971-1974 (Dec. 6, 2002).

D'Andrade, B.W. et al., "Relationship between the ionization and oxidation potentials of molecular organic semiconductors," Organic Electronics 6, 2005, pp. 11-20.

D'Andrade, Brian W., et al., "Efficient organic electrophosphorescent white-light emitting device with a triple doped emissive layer," Advanced Materials, No. 7, 16, Apr. 5, 2004. pp. 624-628.

D'Andrade, Brian W., et al., "High-efficiency yellow double-doped organic light-emitting devices based on phosphorsensitized fluorescence," Appl. Phys. Lett., (2001), vol. 79:7, pp. 1045-1047.

Day et al. "The use of charge transfer interlayers to control hole injection in molecular organic light-emitting diodes," Thin Solid Films, 410 (2002) pp. 159-166.

Dodabalapur et al., "Organic transistors: Two-dimensional transport and improved electrical characteristics," Science, vol. 268, p. 270 (1995).

Feng, X.D. et al. "Ohmic Cathode for Low-Voltage Organic Light-Emitting Diodes," App. Phys. Lett., vol. 86, Article 143511 (Apr. 1, 2005): pp. 1-3.

Gao, W. et al., "Effect of electrical doping on molecular level alignment at organic-organic heterojunctions," Applied Physics Letters, vol. 82, No. 26, Jun. 30, 2003, pp. 4815-4817.

Gu, G. et al., "Transparent organic light emitting devices," Applied Physics Letters, (1996), vol. 68:19, pp. 2606-2608.

Gu, G., et al. "Transparent stacked organic light emitting devices. I. Design principles and transparent compound electrodes," Journal of Applied Physics, 1999, vol. 86, No. 8, pp. 4067-4075.

Gufeng, et al., "Very high-efficiency and low voltage phosphorescent organic light-emitting diodes based on a p-i-n junction," Journal of Applied Physics, vol. 95, No. 10, pp. 5773-5777 (May 15, 2004).

Hack, M. et al. "Status and Opportunities for High Efficiency OLED Displays on Flexible Substrates," Mater. Res. Soc. Symp. Proc., vol. 870E, Article H3.1, Symposium H Giant Area Electronics on Nonconventional Substrates (Mar. 28-Apr. 1, 2005): pp. 1-10.

Harada, K. et al. "Ionized impurity scattering in n-doped C60 thin films," Applied Physics Letters, 91, 092118 (2007).

Harada, K. et al. "Organic Homojunction Diodes with a High Built-in Potential: Interpretation of the Current-Voltage Characteristics by a Generalized Einstein Relation," Phys. Rev. Lett. 94, 036601 (2005).

Higgins, R.W.T. et al. "Emeraldine base polyaniline as an alternative to poly(3,4-ethylenedioxythiophene) as a hole-transporting layer," Advanced Functional Materials, 11, 407-412 (Dec. 1, 2001).

Hino, Yuichi et al., "Efficient low molecule phosphorescent organic light emitting diodes fabricated by wet-processing," Organic Electronics, Aug. 8, 2004, vol. 5, pp. 265-270.

Hong, Il-Hwa et al. "Effective hole injection of organic light-emitting diodes by introducing buckminsterfullerene on the indium tin oxide anode," Applied Physics Letters, 2005, 87, 063502-1.

Hu, Wenping et al., "Efficient red electroluminescence from devices having multilayers of a europium complex," Appl. Phys. Lett. vol. 77, No. 26, Dec. 25, 2000.

Huang, Jingsong et al., "Effect of well number on organic multiple-quantum-well electroluminescent device characteristics," Applied Physics Letters, (1998), vol. 73:23, pp. 3348-3350.

Huang, Jingsong et al., "Influence of the thickness and doping of the emission layer on the performance of organic light-emitting diodes with PiN structures," Journal of Applied Physics, (2003), vol. 93:2, pp. 838-844.

Huang, Jingsong et al., "Low operating voltage and high-efficiency organic multilayer electroluminescent devices with p-type doped hole injection layer," Jps. J. Appl. Phys., (2001), vol. 40, pp. 6630-6633.

Hughes, et al. "Electron transporting materials for organic electroluminescent and electrophosphorescent devices," Journal of Materials Chemistry (2005), vol. 15, pp. 94-107.

Hung, L.S. et al., "Recent progress of molecular organic electroluminescent materials and devices," Materials Science and Engineering Reports, 39, 2002, pp. 143-222.

Ikai, M. et al., "Highly Efficient Phosphorescence From Organic light-emitting devices with an exciton-block layer," Appl. Phys. Lett. vol. 79, No. 2, Jul. 9, 2001.

Ioannidis, A. et al., "Hole and electron transport in chloroaluminum phtalocyanin thin films," The Journal of Physical Chemistry B, 1997, vol. 101, pp. 5100-5107.

Ishii, M. et al., "Improvement of organic electroluminescent device performance by in situ plasma treatment of indium-tin-oxide surface," J. Lumin., 1165 (2000).

Koch, N. et al., "Optimized hole Injection with Strong Acceptors at Organized-Metal Interfaces," Phys. Rev. Lett., vol. 95, pp. 237601-237603, Nov. 30, 2005.

Krieger et al. "Molecular analogue memory cell based on electrical switching and memory in molecular thin films," Synthetic Metals, 122, 199-202 (May 2001).

Kwong, R.C. et al. "Current Status of Electrophosphorescent Device Stability," Org. Electr., vol. 4 (2003): pp. 155-164.

Kwong, Raymond C., et al., "High operational stability of electrophosphorescent devices," Applied Physics Letters, Jul. 1, 2002, vol. 81, No. 1, pp. 162-164.

Lambert, M.A., "Volume-controlled current injection in insulators," Rep. Progr. Phys. 27, 329 (1964).

Lee et al. "The Effect of C60 doping on the device performance of organic light-emitting diodes," Applied Physics Letters, 86 (2005) 063514 (3 pages).

Lee, et al. "Effects of hydroxyl groups in polymeric dielectrics on organic transistor performance," Applied Physics Letters, 88, 162109 (2006).

Liping, Ma et al. "Nonvolatile electrical bistability of organic/metal-nanocluster/organic system," Appl. Phys. Lett. 82, 1419-1421 (Mar. 3, 2003).

Lu, Ping et al., "Synthesis of octasubstituted cyclooctatetrainees and their use as electron transporters in organic light emitting diodes," Journal of the American Chemical Society, 2000, vol. 1222, pp. 7480-7486.

Lupton, J. M. et al., "Bragg scattering from periodically microstructured light emitting diodes," Appl. Phys. Lett., vol. 77, pp. 3340-3342, Nov. 2000.

Ma, E.Y., et al. "Thin Film Transistors for Foldable Displays," IEEE Technical Digest, Electron Devices Meeting, 1997. IEDM '97. (Dec. 7-10, 1997): pp. 535-538.

Madigan, C.F. "Improvement of Output coupling efficiency of organic light emitting diodes by backside substrate modification," Appl. Phys. Lett., vol. 76, pp. 1650-1652, Mar. 2000.

Maennig, B. et al. "Controlled p-type doping of polycrystalline and amorphous organic layers: Self-consistent description of conductivity and field-effect mobility by a microscopic percolation model," Physical Review B, 64, 195208 (2001).

Matsumura, M. et al., "Analysis of current-voltage characteristics of organic light emitting diodes having a LiF/Al cathode and an Al-hydroxyquinoline/diamine junction," Applied Physics Letters, 2872 (1998).

Mattoussi, H. et al., "Photoluminescence quantum yield of pure and molecularly doped organic solid films," Journal of Applied Physics, (1999), vol. 86:5, p. 2642.

Miller, L.L. et al., "A simple comprehensive correlation of organic oxidation and ionization potentials," J. Org. Chem., 1972, vol. 37, No. 6, pp. 916-918.

Mori, T. et al., "Electroluminescence of organic light emitting diodes with alternately deposited dye-doped aluminum quinoline and diamine derivative," Journal of Physics D—Applied Physics, (1999), vol. 32:11, pp. 1198-1203.

Murata, Hideyuki et al., "Efficient organic light-emitting diodes with undoped active layers based on silole derivatives," Applied Physics Letters, Jan. 14, 2002, vol. 80, No. 2, pp. 189-191.

Naito, Katsuyuki et al.; "Molecular design, synthesis, and physical properties of nonpolymeric amorphous dyes for electron transport," The Journal of Physical Chemistry A, 1997, vol. 101, pp. 2350-2357.

Ohmori, Yutaka et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.

Ohmori, Yutaka et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.

Pacios, R., et al., "Charge separation in polyfluorene composites with internal donor/acceptor heterojunctions," Synthetic Metals, 2002, vol. 127, pp. 261-265.

Parker, "On the Problem of Assigning Values to Energy Changes of Electrode Reactions," Journal of the American Chemical Society, 96:17, Aug. 21, 1974, pp. 5656-5661.

Pfeiffer et al., "Controlled p-doping of pigment layers by cosublimation: Basic mechanisms and implications for their use in organic photovoltaic cells," Solar Energy Materials and Solar Cells, vol. 63, pp. 83-99, Jun. 1, 2000.

Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Pope, et al., "Single positive or negative carriers in organic crystals," Electronic Processes in Organic Crystals and Polymers, Oxford Science Publications, Oxford University Press, (1999), pp. 202-207.

Potember, R.S. et al. "Electrical switching and memory phenomena in Cu-TCNQ thin films," Appl. Phys. Lett. 34, 405 (1979).

Pudzich, R., et al., "Synthesis and characterization of new oxadizoleamine based spiro-linked fluorescence dyes," Synthetic Metals, 2003, vol. 138, pp. 21-31.

R. Schlaf et al., "Homo/Lumo Alignment at PTCDA/ZnPc and PTCDA/CIInPc Heterointerfaces Determined by Combined UPS and XPS Measurements," J. Phys. Chem. B 1999, 103, pp. 2984-2992.

Redecker, M., et al., "Electron transport in starburst phenylquinoxalines," Applied Physics Letters, Jul. 5, 1999, vol. 75, No. 1, pp. 109-111.

Sakamoto, Gosuke et al., "Significant improvement of device durability in organic light-emitting diodes by doping both hole transport and emitter layers with rubrene molecules," Applied Physics Letters, (1999), vol. 75:6, pp. 766-768.

Sato, N., et al., "Polarization Energies of Organic Solids Determined by Ultraviolet Photoelectron Spectroscopy," J. Chem. Soc. Faraday Trans. 2, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.

Shinar, J. "Organic Light-Emitting Devices—A Survey" (Adachi et al. "Design concept of molecular materials for high-performance OLED" p. 43)) AIP-Press, Springer, New York 2004.

Shirota, Yasuhiko et al., "A novel class of emitting amorphous molecular materials as bipolar radical formants: 2-{4-[bis(4-methylphenyl)amino]phenyl}-5-(dimesitylboryl)thiophene) and 2-{4-[bis(9,9-dimethylfluorenyl)amino]phenyl}-5-(dimethylboryl)thiophene," Journal of the American Chemical Society, 2000, vol. 122, pp. 11021-11022.

Shirota, Yasuhiko; "Organic materials for electronic and optoelectronic devices," Journal of Materials Chemistry, 2000, vol. 10, pp. 1-25.

Signerski, et al. "The photovoltaic effect in a heterojunction of molybdenyl phthalocyanine and perylene dye," Journal of Non-Crystalline Solids, North-Holland Physics Publishing; vol. 352, No. 40-41, Nov. 1, 2006, pp. 4319-4324.

Tang, C. W., et al., "Electroluminescence of doped organic thin films," Journal of Applied Physics, (1989), vol. 65:9, pp. 3610-3616.

Tang, T.B. et al., "Ionization thresholds of merocyanine dyes in the solid state," Journal of Applied Physics, vol. 59, (1), Jan. 1986, pp. 5-10.

Tobat, P.; Saragi, I. et al., "Organic phototransfer based on intramolecular charge transfer in a bifunctional spiro compound," Applied Physics Letters, Mar. 29, 2004, vol. 84, No. 13, pp. 2334-2336.

Tokito, Shuzuo et al., "Improvement of emission efficiency in polymer light-emitting devices based on phosphorescent polymers," Thin Solid Films, Dec. 15, 2003, vol. 445, No. 2, pp. 353-357.

Tsiper, E.V. and Soos, Z.G.; "Charge redistribution and polarization energy of organic molecular crystals," Physical Review B; vol. 64; 195124-1.

Tsutsui, T. et al., "High quantum efficiency in organic light emitting devices with iridium-complex as a triplet emissive center," Jps. Journal of Applied Physics, part 2 letters, (1999), vol. 38:12B, pp. L1502-L1504.

Tsuzuki, T. et al. "The effect of fullerene doping on photoelectric conversion using titanyl phthalocyanine and a perylene pigment," Solar Energy Materials and Solar Cells, Elsevier Science Publishers, Amsterdam, vol. 61, No. 1, Feb. 15, 2000; pp. 1-8.

Vissenberg, M.C. et al. "Theory of the field-effect mobility in amorphous organic transistors," Physical Review B, 27, 12964 (1998).

Volkel, A. R. et al. "Carrier transport and density of state distributions in pentacene transistors," Physical Review B, 66, 195336 (2002).

Wang, S.D. et al. "Bottom contact ambipolar organic thin film transistor and organic inverter based on $C_{60}$/pentacene heterostructure," Organic Electronics, 7 (2006) pp. 457-464.

Werner, A. G. et al., "Pyronin B as a donor for n-type doping of organic thin films," Applied Physics Letters, vol. 82, No. 25, Jun. 23, 2003, pp. 4495-4497.

Werner, A.G. et al., "n-Type Doping of Organic Thin Films Using Cationic Dyes," Adv. Funct. Mater., vol. 14, No. 3 (Mar. 2004): pp. 255-260.

Wu, C.C. et al. "Integration of Organic LEDs and Amorphous Si TFTs Onto Flexible and Lightweight Metal Foil Substrates," IEEE Electron Device Letters, vol. 18, No. 12 (Dec. 1997): pp. 609-612.

Yamamoria, A et al., "Doped Organic Light Emitting Diodes having a 650-nm Thick Hole Transport Layer," Appl. Phys. Lett. vol. 72, No. 17 (Apr. 27, 1998); pp. 2147-2149.

Yamasaki, T. et al., "Organic Light emitting device with an ordered monolayer of silica microspheres as a scattering medium," Appl. Phys. Lett., vol. 76, pp. 1243-1245, Mar. 2000.

Yang, et al., 2003, "Self-assembly and Magnetic Properties of Cobalt Nanoparticles," Appl. Phys. Lett., 82(26): 4729.

Yang, Y. et al. "Organic electrical bistable devices and rewritable memory cells," Appl. Phys. Lett. 80, 2997 (2002).

Yao, Fu et al., "Quantum-chemical predictions of Absolute standard redox potentials of diverse organic molecules and free radicals in acetonitrile," J. Am. Chem. Soc. 2005, 127, pp. 7227-7234.

Yuan et al. "Fullerene-doped hole transport molecular films for organic light-emitting diodes," Applied Physics Letters, 86 (2005) 143509 (3 pages).

Zhi-Ming, Zhang; "Organic light emitting diodes based on new oxadiazole and pyrazoline derivatives," China Physics Letters, 2000, vol. 17, No. 6, pp. 454-456.

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

Zhou, X., et al. "High-efficiency electrophosphorescent organic light-emitting diodes with double light-emitting layers," Applied Physics Letters, Nov. 18, 2002, vol. 81, No. 21, pp. 4070-4072.

Final Office Action, U.S. Appl. No. 11/426,798; Dec. 30, 2009.
Non-Final Office Action, U.S. Appl. No. 11/426,798; Jun. 24, 2009.
Restriction Requirement, U.S. Appl. No. 11/426,798; Mar. 10, 2009.
Response to Office Action, U.S. Appl. No. 11/426,798; Oct. 22, 2009.
International Search Report for PCT/EP2007/003311; Nov. 1, 2007.
European Search Report and Opinion for EP05028081.7; May 18, 2006.
International Search Report for PCT/EP2006/012403; Mar. 28, 2007.
International Search Report for PCT/DE2005/001076; Dec. 20, 2005.
Supplemental Notice of Allowability for U.S. Appl. No. 10/515,935; Jul. 27, 2007.
Notice of Allowance for U.S. Appl. No. 10/515,935; Jun. 5, 2007.
Office Action for U.S. Appl. No. 10/515,935; Aug. 14, 2006.
International Search Report for PCT/EP2007/011353; Apr. 28, 2008.
International Search Report for PCT/DE2006/000328; May 19, 2006.
Non-Final Office Action for U.S. Appl. No. 12/158,582; Feb. 4, 2010.
International Search Report for PCT/EP2006/012517; Mar. 20, 2007.
International Search Report for PCT/EP2007/000211; Mar. 12, 2007.
European Search Report/Opinon for EP 06026743.2; Nov. 7, 2007.
Non-Final Office Action for U.S. Appl. No. 11/574,058; Dec. 9, 2009.
International Search Report for PCT/DE2005/001493; Jan. 19, 2006.
International Search Report for PCT/DE2008/000638; Sep. 11, 2008.
Non-Final Office Action for U.S. Appl. No. 11/421,249; Oct. 19, 2009.
Response to Office Action for U.S. Appl. No. 11/421,249; Aug. 20, 2009.
Final Office Action for U.S. Appl. No. 11/421,249; May 20, 2009.
Response to Office Action for U.S. Appl. No. 11/421,249; Mar. 18, 2009.
International Search Report for PCT/EP2006/012516; Mar. 27, 2007.
Canadian Search Report for Application No. 2543276; Aug. 24, 2009.
Disclosure Under 37 C.F.R. 1.56 for U.S. Appl. No. 11/279,514 Submitted Herewith.

* cited by examiner

ARRANGEMENT FOR AN ORGANIC PIN-TYPE LIGHT-EMITTING DIODE AND METHOD FOR MANUFACTURING

CROSS-REFERENCE TO RELATED APPLICATION

Applicants hereby claim priority under 35 U.S.C. 119(a) to European Patent Application No. 05008105.8, filed Oct. 7, 2004, the disclosure of which is expressly incorporated herein by reference in its entirety.

The invention relates to an arrangement for an organic pin-type light-emitting diode (OLED) and a method for manufacturing.

BACKGROUND OF THE INVENTION

Since the demonstration of low working voltages by Tang et al. (compare C. W. Tang et al.: Appl. Phys. Lett. 51 (12), 913 (1987)), organic light-emitting diodes have become promising candidates for the realisation of novel illuminating or display elements. They comprise a series of thin layers of organic materials which are preferably vapour-deposited in a vacuum or spin-coated in their polymer form. Following electric contacting by means of metal layers, they form a variety of electronic or optoelectric structural elements such as diodes, light-emitting diodes, photodiodes and transistors. With their respective properties, they provide for competition for the established structural elements on the basis of inorganic layers.

In the case of the organic light-emitting diodes, and by means of the injection of charge carriers, namely electrons from the one side and holes from the other, from the contacts into the adjoining organic layers as a result of an externally applied voltage, the following formation of excitons (electron-hole-pairs) in an active zone and the radiating recombination of these excitons, light is generated and emitted from the light-emitting diode.

The advantage of such structural elements on an organic basis compared with the conventional structural elements on an inorganic basis, for example semiconductors such as silicon, gallium arsenide, is that it is possible to manufacture very large-surface elements, meaning large display elements (monitors, screens). The organic basic materials are relatively inexpensive compared to inorganic materials. Moreover, these materials can be deposited onto flexible substrates because of their low process temperature compared with inorganic materials. This fact opens the way to a complete series of novel applications in the display and illuminating technique.

In the document U.S. Pat. No. 5,093,698 an organic pin-type light-emitting diode is described that involves an organic light-emitting diode with doped charge carrier transport layers. In particular, three organic layers are used, which are located between two electrodes. N-type and p-type doped layers improve here the charge carrier injection and the transport of holes and electrons in the corresponding doped layer. Consequently, the proposed structure consists of at least three layers with at least five materials.

The energy levels HOMO ("Highest Occupied Molecular Orbital") and LUMO ("Lowest Unoccupied Molecular Orbital") are preferably selected in such a way that both charge carriers are "captured" in the emission zone in order to ensure an efficient recombination of electrons and holes. The restriction of the charge carriers to the emission zone is realised by a suitable selection of the ionisation potentials and/or electron affinities for the emission layer and/or the charge carrier transport layer, as will be explained later.

The element structure as known from the document U.S. Pat. No. 5,093,698 leads to a greatly improved charge carter injection from the contacts into the organic layers. The high conductivity of the doped layers, moreover, reduces the voltage decline occurring at that location during the operation of the OLED. For this reason, doped structural elements should require significantly lower operating voltages for a desired luminance than comparable non-doped structures. Further examinations, related hereto, of such doped structural elements have shown, however, that this is not necessarily the case. In the original pin-structure, exciplex formation as well as the so-called luminescence quenching effects cannot be ruled out, and this has a negative effect on the quantum yield of the electroluminescence. Luminescence quenching occurs particularly in such a case when p- or n-dopants are in the immediate vicinity, meaning, in the organic layer adjoining the emission zone.

In the document DE 100 58 578 C2, block layers were inserted between the central emission layer and at least one charge carrier transport layer for these reasons. In this case, the charge carrier transport layers are also doped either with acceptors or donors. It is described as to how the energy levels of the block materials are to be selected in order to enrich electrons and holes in the light emitting zone. Thus, the known structure does in fact enable high efficiencies as the additional intermediate layers also act as a buffer zone to the formerly possible quenching effects at dopant disturbance locations.

A luminescence quenching can be caused by several effects. One possible mechanism is known as exciplex formation. In such a case, holes and electrons that should actually recombine with one another on an emitter molecule in the emission zone are located on two different molecules on one of the boundary surfaces to the emission layer. This so-called exciplex condition can be understood as a charge-transfer-exciton where the participating molecules are of a different natures. With an unsuitable selection of the materials for block and emission layer, respectively, this exciplex is the energetically lowest possible excitated condition, so that the energy of the actually desired exciton on an emitter molecule can be transferred into this exciplex condition. That leads to a reduction of the quantum yield of the electroluminescence and, consequently, of the OLED. In some cases the red-shifted electroluminescence of the exciplex is also observed. As a rule, however, this is then characterised by very small quantum yields.

Further mechanisms of the luminescence quenching occurring in OLEDs originate as a result of an alternating effect of excitons with charged and uncharged dopant molecules on the one hand and/or with charge carriers on the other hand. The first mechanism is effectively suppressed by means of the use of non-doped block layers based on the short range of the alternating effect. Charge carriers during the operation of the OLED must inevitably occur in and in the vicinity of the emission zone. For this reason there can only be an optimisation to that extent that an accumulation of charge carriers, for example in a band discontinuity, is avoided. This imposes, in particular, demands on the selection of the tape layers for block material and emitters in order to avoid barriers for the charge carrier injection and, subsequently, an accumulation of charge carriers.

A pin-structure according to the document DE 100 58 578 C2 already comprises at least five single layers with more than six different organic materials owing to the fact that the functionality of each single layer is closely linked to the specific energy level, as is described in greater detail in the document DE 100 58 578 C2.

A first step for simplification is provided by BPhen/BPhen: Cs layer sequences (compare He et al.: Apply. Phys. Let., 85 (17), 3911 (2004)). This system uses the same matrix material, namely BPhen, both in the electron transport layer as well as for the directly adjacent hole block layer. With this known system, however, the possible exciplex formation is not prevented because of a decisive energy level difference between LUMO of BPhen and the HOMO of the matrix used for the emission zone. In actual fact, an improvement of the structural element by means of the selection of TAZ for the hole block layer is reported. Accordingly, the layer sequence BPhen/BPhen:Cs does not correspond to the simplification of layer structures while maintaining the efficiency of structural elements, which takes place with the help of a specific selection of the materials concerned. In particular, the known system is not compatible with the combination of emitter materials selected at that location. Furthermore, the structure as described by He et al. contains at least four matrix materials.

Furthermore, a structure is known in which the emission layer and a charge carrier transport layer consist of the same organic matrix material (compare J. Kido, Proc. $1^{st}$ Int. Display Manufacturing Conference IDMC 2000, Seoul, 2000). Here, a structural element emitting organic light is explained that uses an Alq3 layer as emission layer, onto which again a Li-doped Alq3 electron transport layer is adjacent. This sequence is not embedded in a pin-OLED structure, where not only acceptors in the hole transport layer are present but also donors in the electron transport layer.

SUMMARY OF THE INVENTION

The task of the invention is to state and present an arrangement for an organic pin-type light-emitting diode and a method for manufacturing, where the structural configuration of the stack of organic layers is simplified.

This task is solved by an arrangement for an organic pin-type light-emitting diode according to Claim 1 and according to Claim 12, as well as a method for manufacturing a stack with organic layers for an organic pin-type light-emitting diode wherein a first organic matrix material is processed with the help of a separating device, characterized in that the first organic matrix material is used for several organic layers of the stack.

Advantageous embodiments of the invention are subject-matter of dependent subclaims.

According to one aspect of the invention, an arrangement for an organic pin-type light-emitting diode with an electrode and a counter-electrode and a stack with organic layers between the electrode and the counter-electrode is created, where the stack with the organic layers comprises an emission layer comprising k (k=1, 2, 3, . . . ) organic matrix materials, a doped charge carrier transport layer, which is arranged between the electrode and the emission layer, a further doped charge carrier transport layer, which is arranged between the counter-electrode and the emission layer, and at least one block layer, which is arranged between one of the doped charge carrier transport layers and the emission layer. The organic layers of the stack are formed by means of n (n≦k+2) organic matrix materials, where the n organic matrix materials comprise the k organic matrix materials of the emission layer.

According to another aspect of the invention, an arrangement for an organic pin-type light-emitting diode with an electrode and a counter-electrode and a block-layer-free stack with organic layers between the electrode and the counter-electrode is created, where the block-layer-free stack comprises an emission layer, a doped charge carrier transport layer arranged between the electrode and the emission layer, and a further doped charge carrier transport layer, which is arranged between the counter-electrode and the emission layer. The emission layer and the doped charge carrier transport layer of the block-layer-free stack are formed from an organic matrix material.

With such an arrangement the overall number of adopted organic matrix materials and the number of layers are reduced by the fact that, in addition to the formation of several layers of the stack of organic layers, namely the emission layer, of the doped charge carrier transport layer and the further doped charge carrier transport layer from one and the same matrix material, block layers are saved.

According to a further aspect of the invention, a method for the manufacture of a stack with organic layers for an organic light-emitting diode of the simplified pin-type is created, where an organic matrix material is processed with the help of a separating device. This organic matrix material is used for several organic layers of the stack.

An organic matrix material in the sense of the invention is every organic host material to which further materials such as dopants or emitter substances, typically in the molar concentrations 1:100 000 to 5:1, can be admixed (doping). Furthermore, the sole constituent of a non-doped layer, for example block layers, is designated as a matrix. Fluorescent or phosphorescent emission materials are selectable as dopants for emission layers. Moreover, there are also emission layers, which emit light without doping—in this case the matrix is the emitter.

The simplified layer arrangements for pin-type OLEDs indicate no relevant disadvantages with regard to the usual characteristic data and in this respect are of equal standing with the known complex structures. Light-emitting diodes with the use of such layer arrangements have a high efficiency in the range of the required brightness.

The new layer arrangements for pin-type OLEDs are the result of comprehensive efforts in the field of research. Success was achieved in optimising various and partly antagonistically acting demands on the properties of the materials in the stack of organic layers to that extent that not only simple but also efficient pin-OLED structures can be realised. Compared to conventional organic light-emitting diodes with non-doped charge cater transport layers, the variety of the various requirements for the adopted matrix materials is substantially more complex with organic pin-type light-emitting diodes due to the envisaged doping of the charge carrier transport layers.

One advantage of the invention lies in the fact that the realisation of layer arrangements for pin-type OLEDs is enabled, which consist of less layers and/or less organic matrix materials than conventional layer arrangements. In a simplified structural element configuration the number of the adopted organic matrix materials and the adopted layers is limited where one and the same organic matrix material is used for several functional layers. This approach facilitates the quality assurance based on non-complicated processability and reliable manufacturing of OLED structural elements. In addition, investment and consumption costs for manufacturing plants can be minimised.

In addition to the substantially simplified processing, the limited number of required materials is also an advantage of the invention. Moreover, the manufacturing process is simplified be cause a reduction of the number of the sources required for layer separation is possible. When several organic layers in series are formed by one and the same organic matrix material, the manufacturing process is simplified as a result. For example, in one preferred embodiment the evaporating source for this matrix material can be continually operated, where, in each case, the source shadowing of the sources for the additional substances has to be opened for a short period of time only.

If, in an embodiment for example in a layer structure, the emission layer as well as the block layer and the charge carrier transport layer consist of a stipulated matrix material, a source for the matrix material and a source for each of the emitter dopants and the electric dopants are required. The layer structure can then be manufactured in such a way that, with running operation of the source for the organic matrix material, at first the source of the emitter dopants is opened and again shadowed off for the formation of the block layer and finally, for the separation of the charge carder transport layer, the source of the electric dopant is opened. These advantages become effective, for example, during manufacturing with the use of conventional thermal evaporation in the high vacuum as well as during the separation of layers with the held of the method "Organic Vapour Phase Deposition" (OVPD) (compare M. Baldo et al., Adv. Mater. 10 (18), 1505 (1998).

With various and preferred embodiments of the invention, it can be achieved that the overall number n of the organic matrix materials used for the manufacture of the stack of organic layers can be reduced further, so that n≦k+1 or even n=k applies if k (k=1, 2, 3 . . . ) is the number of the organic matrix materials used in the emission layer.

DESCRIPTION OF PREFERRED EMBODIMENTS OF THE INVENTION

Figure 2A:
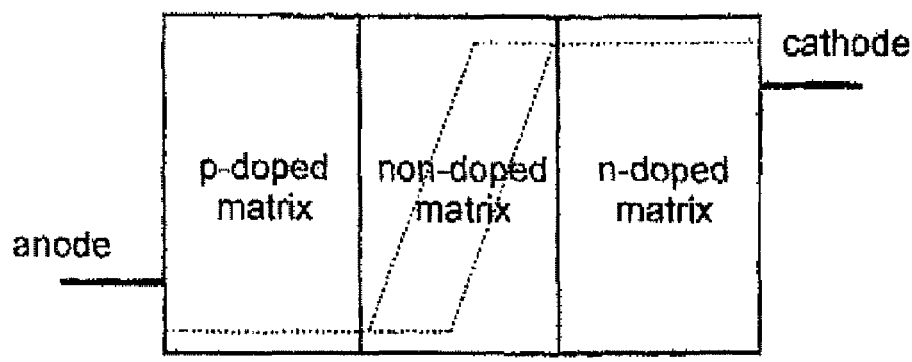
Figure 2B:
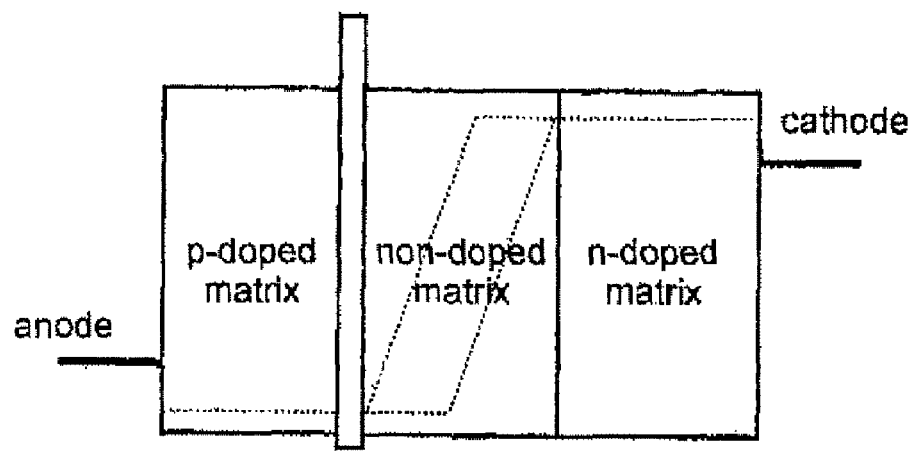
Figure 2C:
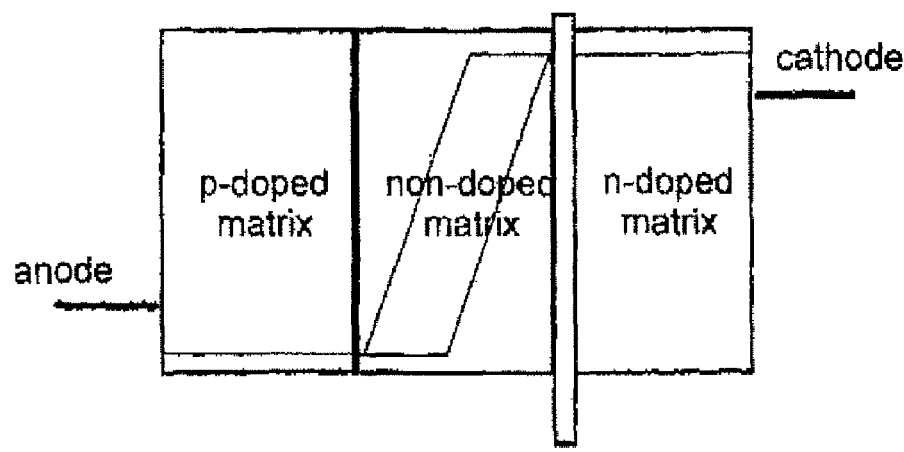
Figure 3A:
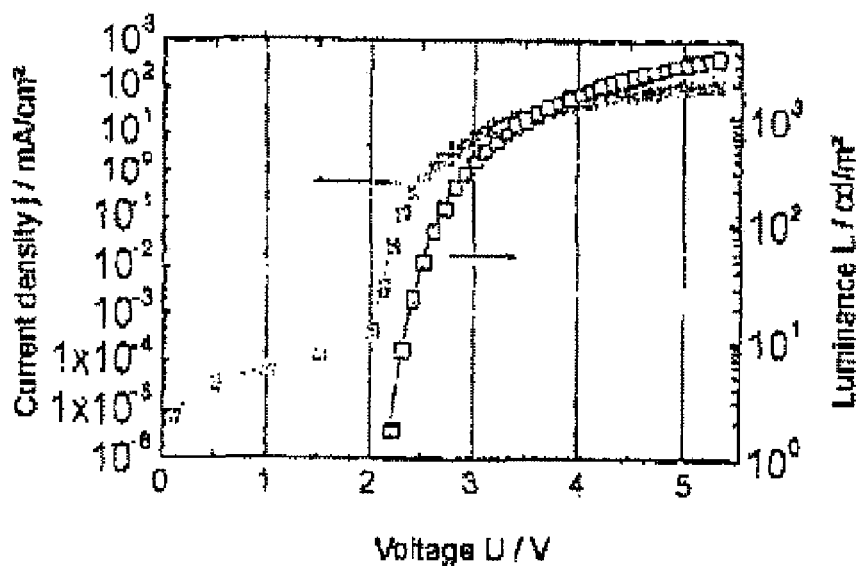
Figure 3B:
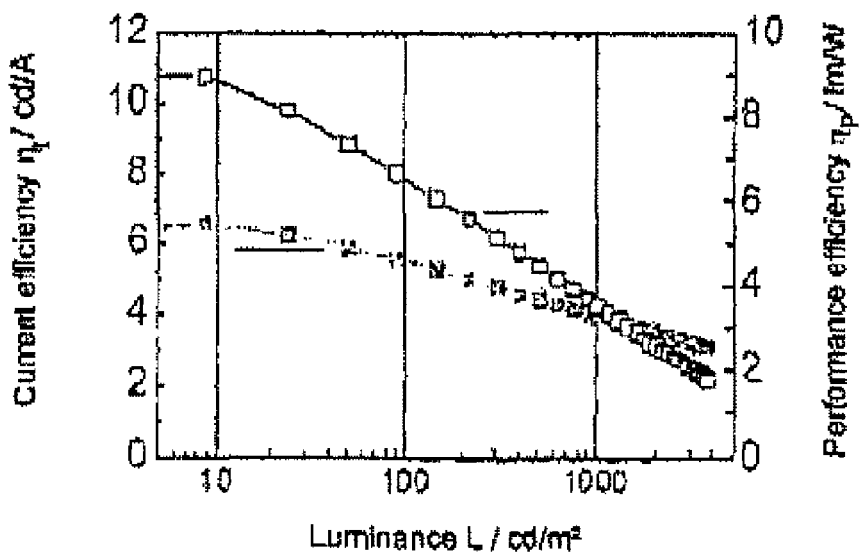
Figure 4A:
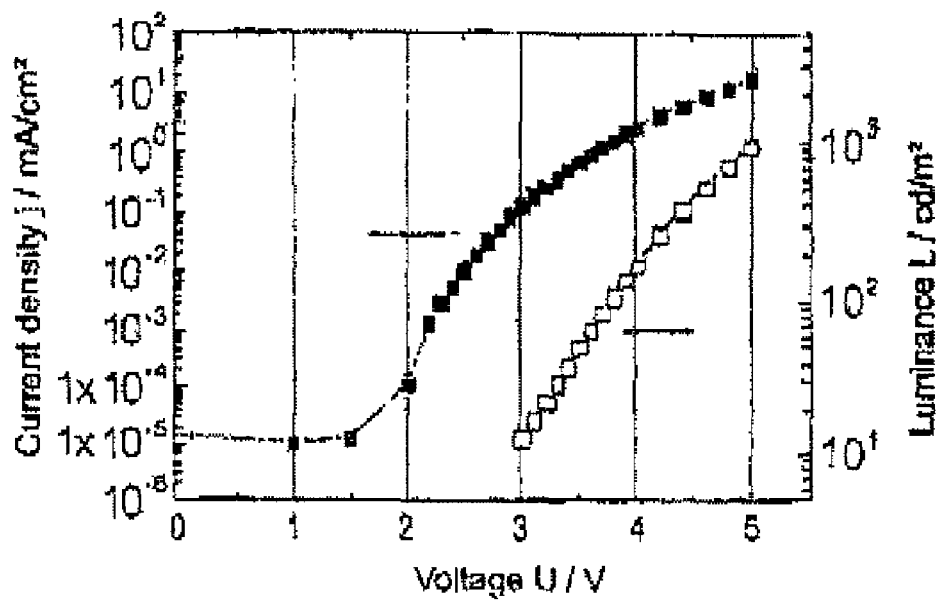
Figure 4B:
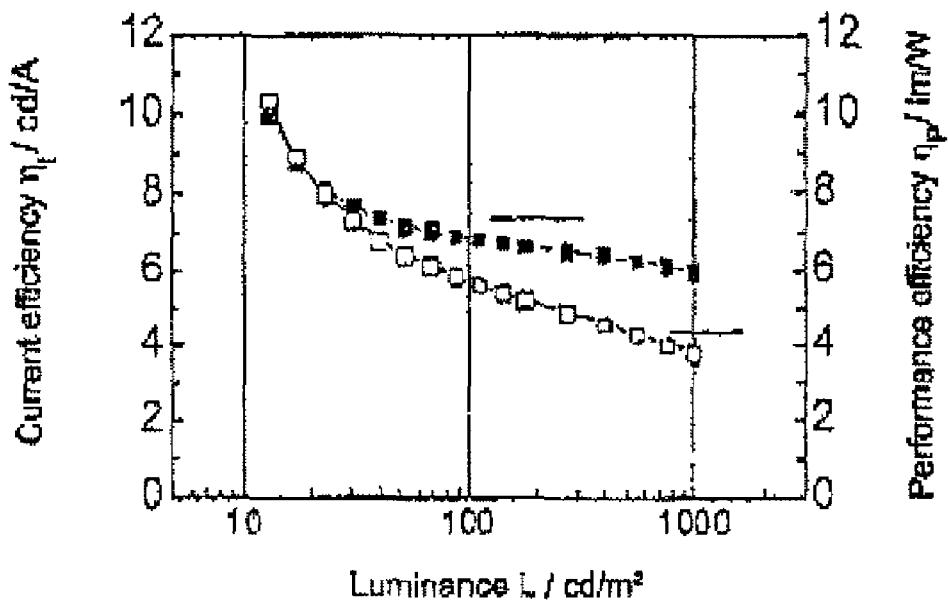
Figure 5A:
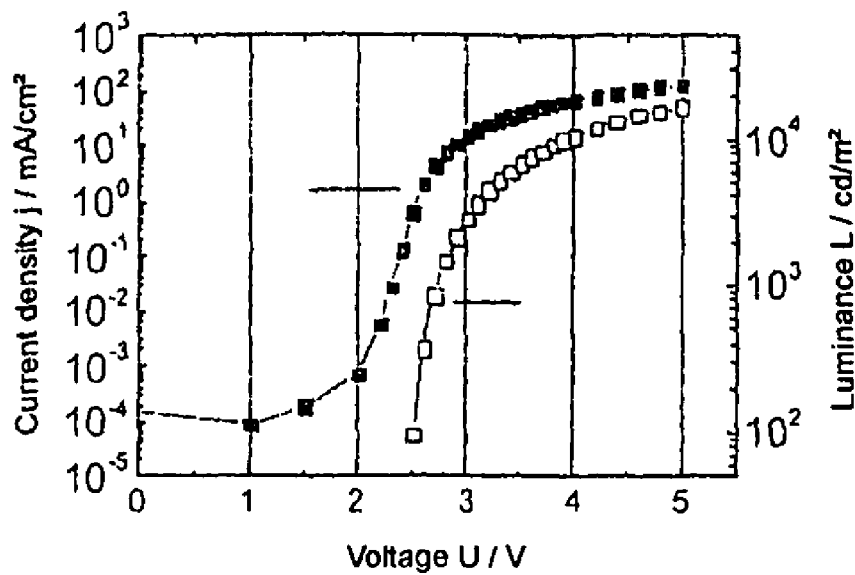
Figure 5B:
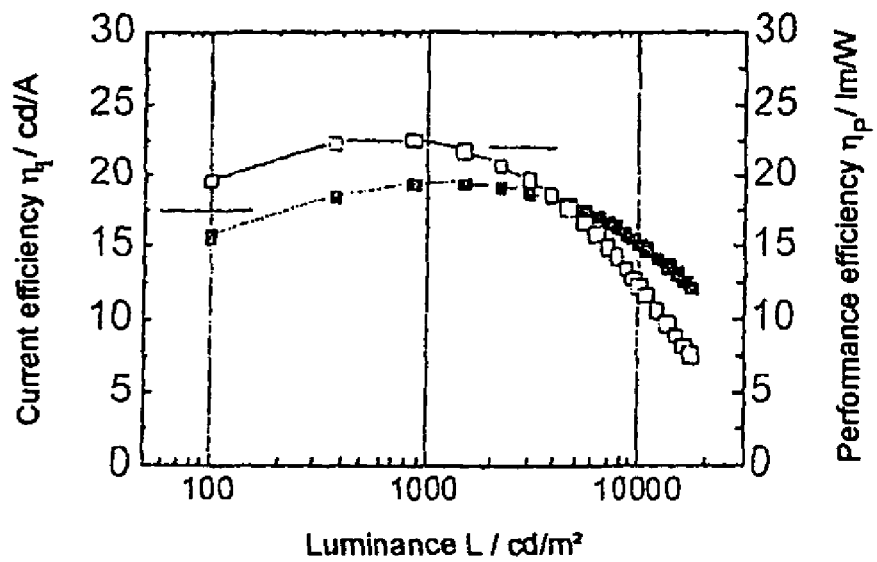
Figure 6:
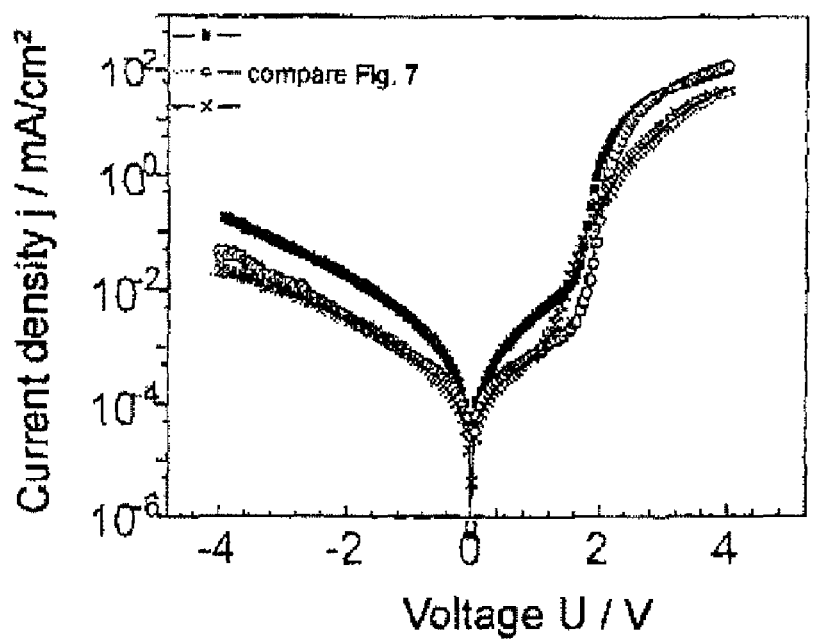
Figure 7:
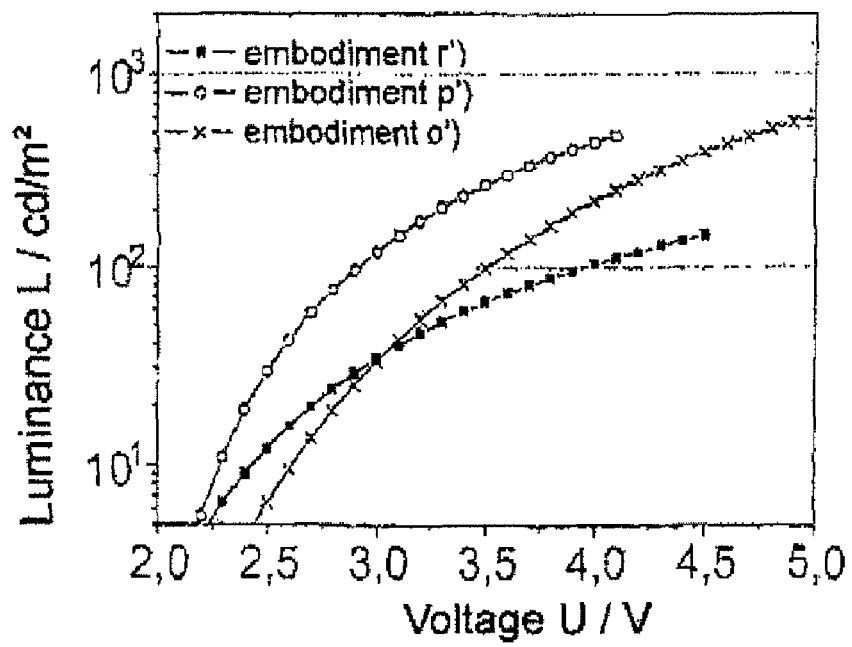
Figure 8:
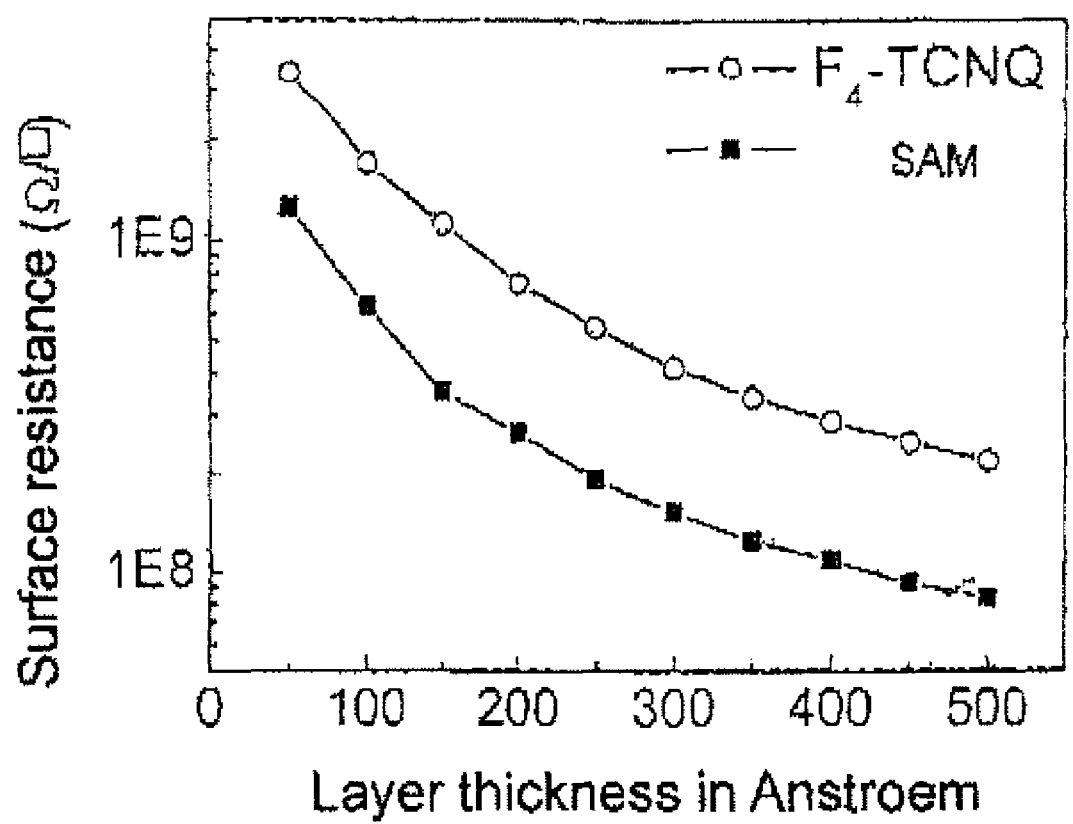

The invention is described as follows in greater detail on the basis of embodiment examples with reference to the Figures of the drawing. These Figures shows the following:

FIG. 1 a schematic illustration of a layer arrangement for a light-emitting structural element with multiple layers;

FIG. 2A to 2C schematic illustrations of energy levels for an arrangement of organic layers where at least two adjacent layers are made from the same organic matrix material;

FIGS. 3A and 3B a graphic illustration of characteristic data for the current density and the luminance as well as the current efficiency and the performance efficiency of a structural element on the basis of a structure according to an embodiment c');

FIGS. 4A and 4B a graphic illustration of characteristic data for the current density and the luminance as well as the current efficiency and the performance efficiency of a structural element on the basis of a structure according to an embodiment a');

FIGS. 5A and 5B a graphic illustration of characteristic data for the current density and the luminance as well as the current efficiency and the performance efficiency of a structural element on the basis of a structure according to an embodiment n);

FIG. 6 a graphic illustration of characteristic data for the current densities of structural elements according to the embodiments o'), p'), r');

FIG. 7 a graphic illustration of characteristic data for the luminance for the structural elements according to the embodiments o'), p'), r'); and FIG. 8 a graphic illustration of the surface resistance over the layer thickness of two hole transport layers with the various dopants F4-TCNQ and 2-(6-dicyanomethylene-1,3,4,5, 7,8-hexafluoro-6H-naphtalene-2-ylidene)-malononitrile, which are embedded in the same matrix with equal concentration.

FIG. 1 shows the usual structure of an organic light-emitting diode (OLED). A base electrode 1 is deposited in a structured manner onto a carrier substrate S, for example glass or poly-Si. In the next step, the layer-wise thermal evaporation and separation of a stack of organic layers is effected whose properties are specified more precisely further below. Finally, a cover electrode 5 is deposited, which covers the upper organic layer of the stack processed beforehand.

At least one of the electrodes is transparent in any case in order to allow the light emission. In the case of an organic "bottom-emission" diode where the generated light is radiated through the substrate, both the substrate S as well as the base electrode 1 must be transparent. It is however necessary that, with an organic "top-emission" diode, the cover electrode 5 and an encapsulation of the structural element are adequately transparent. It is also conceivable that both sides of the structural element are transparent so that the diode appears transparent.

It is to be emphasised at this point that both electrodes 1 and 5 can inject either electrons or holes, but that no restriction is to be effected with regard to the actual polarity of the presented structural element. For this reason, the invention can be implemented in conjunction, with inverted (base electrode as cathode) as well as with non-inverted (base electrode as anode) structural elements including time-saving and cost-favourable manufacturing processes.

The non-inverted stack of organic layers comprises five basic components: a p-type doped hole transport layer 2, a non-doped intermediate layer on the hole side, namely an electron block layer 3, a light-elementing emission layer with k (k=1, 2, 3 . . . ) layers, a non-doped intermediate layer on the electron side namely a hole block layer 3', and an n-type doped electron transport layer 2'.

However, if an inverted structure is selected, then the n-type doped electron transport layer 2 is followed by a non-doped intermediate layer on the electron side, namely a hole block layer 3, then the light-emitting emission layer 4 with k (k=1, 2, 3 . . . ) layers, the non-doped intermediate layer on the hole side, namely an electron block layer 3', and the p-type doped hole transport layer 2'.

With regard to the dopants, it is to be noted that acceptor molecules for p-type doping are selected preferably from the group of the quinones (compare also for this purpose DE 103 57 044.6). A well known example is F4-TCNQ that is frequently used in order to dope organic hole transport layers. This has been elaborately described by Pfeiffer for example (compare Appl. Phys. Lett., 73, 22 (1998)). As an alternative, other oxidising substances are also applied for p-doping, for example FeCl3 (compare J. Endo et al. Jpn. J. Appl. Phys. Pt. 2, 41, L358 (2002)). For n-doping it is standard practice to select elements from the group of the alkaline metals (for example Li, Cs) or alkaline earth metals (for example Mg). However, molecular donors can also be used.

The stack of organic layers is described as follows in greater details. In this case, O1 to O4 designate in general different organic matrix materials. The organic matrix materials O1 to O4 are partially dopable, selectively by means of n-doping and/or p-doping. At first, the same organic matrix material O1 is used for the layers 2 and 3 of the stack. At the same time, another organic matrix material O2 is used as a matrix for the two layers 2' and 3':

p-doped O1/O1/4/O2/n-doped O2

This layer arrangement corresponds to a stack of organic layers with a p-doped hole transport layer from the organic matrix material O1, an electron block layer from the organic matrix material O1, the emission layer 4, a hole block layer from the organic matrix material O2 and an n-doped electron transport layer from the organic matrix material O2. These embodiment examples have in common that, for the p-doped hole transport layer and the adjacent electron block layer, the same organic matrix material O1 is used and for the n-doped electron transport layer and the adjacent hole block layer the same organic matrix material O2 is used. The p-doped hole transport layer and the relevant and adjacent electron block layer as also the n-doped electron transport layer and the relevant and adjacent hole block layer are each made from the same organic matrix material, where the transport layers have a doping but the block layers do not. For this reason, a doping gradient is formed in each case within the two matrixes consisting of transport layer and block layer.

In principle, a pin-structure is envisaged where the overall number of the organic matrix materials used in the stack of the organic layers exceeds by not more than two the number of the organic matrix materials used for the emission layer. The organic material(s) used for the emission layer 4 can be fluorescent as well as phosphorescent. The emission layer can then be designed as a plain emission layer (k=1), where the emission layer consisting of:

a) O1 or
b) O2 or
c) O3 or
a') a system consisting of matrix O1:emitter or
b') a system consisting of matrix O2:emitter or
c') a system consisting of matrix O3:emitter.

The designation "matrix Ox:emitter" means that the emission layer is formed from an organic matrix material Ox (x=1, 2, . . . ) and an added emitter material. However, the emission layer 4 can also be configured as a double emission layer (k=2), where d) O1 on the hole side and O3 on the electron side or
e) O3 on the hole side and O2 on the electron side or
f) O1 on the hole side and O2 on the electron side or
g) O3 on the hole side and O4 on the electron side are arranged.

The emission layer 4 can be furthermore designed as a double emission layer, where as organic matrix material for one or several added emitters the following selections are made:

d') O1 on the hole side and O3 on the electron side or
e') O3 on the hole side and O2 on the electron side or
f') O1 on the hole side and O2 on the electron side or
g') O3 on the hole side and O4 on the electron side.

Therefore, the organic matrix materials of the transport layers are in each case identical with the adjacent block layers or even a component of the emission layer. A prerequisite for this is, however, that the organic matrix material O1 (and/or O2) can be doped with acceptors (donors) and functions at the same time as a barrier for electrons (holes) in the organic stack, during which it also allows that holes (electrons) access the emission zone. An exception are the embodiment examples c), c'), g) and g') where the organic matrix material of the emission layer differs from that of the block layers.

The stated structures are the result of comprehensive examinations and are substantially simplified compared to the known complex structures as stated, for example, in the document DE 100 58 578 C2. In addition to this, critical parameters were determined, which preferably have the individual materials for a certain function, namely in particular as doped charge carrier transport layer, block layer or emission layer. These parameters are, in particular, the energetic positions of the charged and/or excited conditions of this molecule. The description of these parameters is given below.

These examinations were combined with comprehensive test series for the identification of materials whose properties enable their application for a plurality of the required functions. For the purpose of gaining a more indepth understanding, simulations of OLEDs were carried out with a specially developed program. The procedure is described in an exemplary manner as follows and the knowledge as well as the design rules derived therefrom are stated.

The procedure is explained with the example of the hole transport layers adjacent to the anode. A pin-OLED with MeO-TPD as a hole transport layer, Spiro-TAD as electron block layer and TAZ as anode-side emitter matrix are deployed as this is known (compare He et al.: Appl. Phys. Lett., 85 (17), 3911 (2004)). An observation of the ionisation potentials of the participating substances shows that the barrier for holes during transport of hole transport layer to the electron block layer is 0.3 eV. The hole injection from the electron block layer into the emission layer is effected barrier-free (compare Pfeiffer et al.: Adv. Mat., 14 (22), 1633 (2002)). The barrier for the injection of holes from the anode into the hole transport layer is approximately 0.5 eV. It is known that the anode made of ITO with hole transport materials with similar ionisation potential such as MeO-TPD forms ohmic contacts. With regard to the potential layers of the participating substances, the anode-side OLED structure as stated by He et al. corresponds essentially to the structures, which were reported for pin-OLEDs with block layers up to now, in the first instance by Huang et al. (Appl. Phys. Lett. 80 (1), 139 (2002)).

In order to realise a plain OLED structure, the number of applied matrix materials was reduced. All known realisations of efficient pin-OLEDs use different matrix materials for the hole transport layer and the electron block layer. The cause for this is that the doping capability of the hole transport layer on the one band, and the good function of the electron block layer on the other, impose very different demands on the properties on these layers.

At first, the p-doped hole transport layer was made from Spiro-TAD. It was evident here that Spiro-TAD can not be adequately doped with the normally used acceptor molecule F4-TCNQ. The result is that the contact to ITO is no longer ohmic and light emission can only be observed with comparably high operating voltages. Furthermore, the electron block layer was manufactured from non-doped Spiro-TTB (2,2',7,7'-Tetrakis-N,N-ditolylamino)-9,9'spirobifluorene), whereas the hole transport layer consists of p-doped Spiro-TTB. With reference to the ionisation potential and the doping capability with F4-TCNQ, this material is to be regarded as being equivalent to MeO-TPD. It was discovered here that an ohmic contact to the ITO is however formed but that, on the other hand, minor efficiencies for light emission occur due to the high barrier for hole injection into the emission layer used here. The cause is quenching effects resulting from exciplex formation and luminescence quenching at the accumulated holes at the boundary surface between block layer and emission layer. Furthermore, other hole transporting materials with a higher ionisation potential than MeO-TPD, but with a lesser ionisation potential than Spiro-TAD, were used as p-doped hole transport layer and as electron block layer. It was discovered here that none of the materials, in the doped case on the one hand, forms ohmic contacts with ITO and at the same time, on the other hand, does not produce any quenching effects in the emission layer. Electrical simulations showed that a barrier of approximately 200 meV between two organic layers does not yet substantially influence the current transport, but that at about 400 meV considerable accumulation build-up already occurs.

It was recognised that the problem can be solved if acceptor molecules stronger than F4-TCNQ are used. In this way, materials with a higher ionisation potential than MeO-TPD or Spiro-TTB could also be doped, and even Spiro-TAD under certain circumstances. However, acceptor molecules stronger than F4-TCNQ were unknown in the state of the art up to the present. An acceptor molecule stronger than F4-TCNQ was used, which is 2-(6-dicyanomethylene-1,3,4,5,7,8-hexafluoro-6H-naphtalene-2-ylidene)-malononitrile and which is designated in the following as SAM (compare FIG. 8). It was discovered that a doping of Spiro-TAD was actually successful in that way. It was possible in that way to form the doped hole transport layer and the electron block layer from the same material (Spiro-TAD) and at the same time to ensure a good injection from the anode formed with ITO and minor quenching effects at the boundary surface to the emission layer.

Finally, Spiro-TAD was used also as a matrix material for red triplet emitters, and this made possible a further simplification of the OLED (compare application example a' above).

In a next step, it was examined to what extent one or several block layers are necessary at all with the novel layer structures. Block layers can be deployed in order to avoid negative quenching effects. Up to now, all efficient OLEDs with pin-structure have two block layers, in each case one on the cathode side and one of the anode side.

An important factor for the understanding of the quenching effects is the knowledge of the location of the recombination zone of the pin-OLEDs. As excitons in organic layers have as a rule limited diffusion length in the magnitude of 10 nm, there is only an appreciable exciton density in the structural element also only within the diffusion range. As a rule, quenching effects are attributable to short-range alternating effects with excitons. For this reason, the source of these effects must be within the diffusion zone around the recombination area in order to noticeably worsen the efficiency. Little is known about the location of the emission zone in pin-OLEDs. Experiments with the so-called "doped-slab" technique were carried out for conventional OLEDs. In this case, various OLEDs were manufactured with the same structure for which, in each case, a very thin exciton sensor layer was introduced at various positions in the emission layer. The luminescence signal of the exciton sensor layer is assumed as being proportional to the exciton density locally. In conventional OLEDs, a difference was made between so-called electron-rich and/or electron-poor structures. In the first case, the recombination zone is primarily on the anode side of the emission layer, whereas in the second case it is on the cathode side. The cause for electron surplus and/or electron shortage is, in addition to the differently large mobility for electrons and holes, the barriers for the charge carrier injection in particular.

Furthermore, another method was selected for the examination of pin-diodes, namely the comparison of OLEDs with a variation of the thicknesses of the transport layers with an optical model. This variation leads to a variation of the distance of the emission layer from the reflecting electrode, which is frequently a cathode. Displacements in the emission spectrum and a variation of the decoupling efficiency and the emission characteristics result because of interference in the originating thin layer system.

The comparison of experiment and optical simulation for various locations of the emission zone in the stack enables the determination of their actual location in the structural element. In the result of these experiments it was discovered that, for pin-OLEDs, the location of the emission zone is established not by barriers for load carrier injection but rather primarily because of the relation of movements for electrons and holes in the emission layer. The differentiation between electron-poor and electron-rich OLEDs therefore loses its original significance. If the electron mobility is prevailing in relation to the hole mobility in a concrete emitting layer, the recombination takes place in the vicinity of the electron block layer. This means that, in this case and with sufficient thickness of the emission layer, the exciton density at the hole block layer is very small. Quenching effects at this boundary surface are thus insignificant, and the hole block layer is not required. By way of analogy, the electron block layer is not required with a dominating hole mobility. For examination purposes, OLEDs were manufactured (see below) where no non-doped intermediate layer is inserted between the hole transport layer and the emission layer with a dominating hole mobility. Strong quenching effects are normally expected for such OLEDs as the requirements for practically all types of luminescence quenching at the boundary surface are established, namely the presence of the charged dopant anions, the accumulation of a high hole density due to a high barrier to the emission layer and the energetic acceptance of exciplex formation. In fact, it was observed that the efficiency of these structures is very high. A surprising result that can, however, be explained with the help of the reasons stated above.

Properties with regard to the energy levels of the participating materials are compiled as follows for the manufacture of efficient but uncomplicated structured OLEDs.

As the available acceptors (donors) have a limited doping strength (according to electron affinities and/or ionisation potentials), maximum values for the ionisation potential (minimal values for the electron affinity) result therefrom for the organic matrix materials O1 to O4. In order to additionally serve as an electron (hole) barrier, there are additionally maximum values for the electron affinity (minimal values for the ionisation potential) of the organic matrix materials.

The commercially available acceptor molecule F4-TCNQ can be used as a p-dopant in a hole transport material. It has an electron affinity EA(A) of approximately 5.3 eV (estimation from cyclovoltammetry). For a matrix O1 doped with F4-TCNQ, there is therefore the requirement that the ionisation potential IP(O1) (estimated from cyclovoltammetry) is 0.5 eV larger as a maximum. Caesium atoms are frequently used as donors. Atomic caesium has an ionisation potential of 3.9 eV. Based on a strong alternating effect between matrix and dopant (complex formation) it is however possible to dope matrix materials with a far smaller electron affinity. The well known matrix material BPhen has, for example, an electron affinity between 3.0 eV (estimation from ionisation potential and optical band gap) and 2.4 eV (estimation from cyclovoltammetry). However, it can be expected that, for materials with an electron affinity smaller by 0.5 eV, a doping effect with caesium cannot be achieved. For a molecular n-dopant, and based on the details for p-dopants, in the result the electron affinity of the matrix EA(O2) shall not drop below the value, reduced by 0.5 eV, of the ionisation potential of the donor IP(D).

Consequently, the following relationships result from the requirement of the doping capability: IP(O1)<EA(A)+0.5 eV and/or EA(O2)>IP(D)−0.5 eV. The following applies in the case of doping with caesium: EA(O2)>1.9 eV.

For the fulfillment of the barrier characteristics, the requirement on the EA(O1) and/or IP(O2) results from the potential levels of the emission layer. Electrons that move energetically it the level of the electron affinity of the emission layer EA(E) shall only access the layer O1 at a low rate. The result is subsequently: EA(O1)<(E)−0.2 eV. At the same time, holes that move energetically in the level of the ionisation potential of the emission layer IP(E) shall only access the layer O2 at a low rate: IP(O2)>IP(E)+0.2 eV. Attention is drawn again here to the fact that the conditions for barrier characteristics do not have to be fulfilled in every OLED stack. If the emission zone is near to the hole transport layer, there is frequently no necessity that the layer adjacent to the emission stack on the cathode side represents a barrier for holes. The same applies for an OLED with an emission zone near the electron transport layer, in that there is frequently no necessity that the layer adjacent to the emission stack on the anode side represents a barrier for electrons.

In order to obtain an efficient injection of charge carriers from the individual charge carrier transport layers and/or the block layers into the emission layer, it is to be demanded that the barriers to be overcome by the charge carriers it this case are not too large, meaning, smaller than 0.5 eV. It is emphasised here that, where higher barriers are concerned, an increase of the operating voltage is to be expected on the one hand. On the other hand, a reduction of the efficiency of the emission can also occur if the accumulated charge carrier density at the boundary surface to the emission layer leads to an increase of the non-radiating recombination of excitons in the emission layer. On the whole, these criteria result: IP(O1)>IP(E)−0.5 eV and EA(O2)<EA(E)+0.5 eV.

It is at first surprising that, on the one hand, an efficient charge carrier injection into the emission layer can take place if the barrier is up to 0.5 eV, but on the other hand the performance of the diode is not detrimentally affected if the barrier for the injection from the emission layer into the block layer is only 0.2 eV. This is attributable to the fact that the desired recombination of electrons and holes occurs within the emission layer as a competing process to the charge carrier loss into the block layers. For this reason, the residence time of the charge carriers in the vicinity of the barrier in the emission layer is significantly shorter than in the case of a unipolar charge transport layer. This leads to a limitation of the charge carrier losses also for comparably small barriers. Material examples are: BPhen can be doped with caesium, but at the same time can also be used as a hole block layer and matrix for the green emitting molecule Ir(ppy)3.

On the hole side, Spiro-TAD offers the possibility at the same time for p-doping and as electron block layer and functions additionally as a matrix for red emitters also, for example.

In the following, further embodiment examples for layer arrangements in the stack of organic layers are explained in greater detail for an organic pin-type light-emitting diode. O1 to O4 again designate generally different organic matrix materials.

m) p-doped O1/O1/O1:emitter/O3/n-doped O2
n) p-doped O1/O3/O2:emitter/O2/n-doped O2

As previously explained in an exemplary manner, such an arrangement leads to the formation of a kind of uniform transition on only one side of the emission layer in each case which is shown in the embodiments blow as an underlined text. A uniform transition in the sense of the invention is a layer sequence that is formed from a charge carrier transport layer up to the emission layer by means of a uniform matrix. If the emission zone is in the middle of the emission layer, the block layers can be deleted. This leads to the structures m*) and n*):

m*) p-doped O1/O1:emitter/n-doped O2
n*) p-doped O1/O2:emitter/n-doped O2

After the stepwise adaptation of the layer materials (compare embodiment examples o), o*), p), p*), q) below), the structures of the embodiment examples r), s), t) can be realised where the HOMO-levels and the LUMO-levels perfectly assimilate because the same matrix material is used all the way through in all layers.

o) p-doped O1/O1/O1:emitter/O2/n-doped O1
o*) p-doped O1/O1:emitter/O2/n-doped O1
p) p-doped O1/O2/O1:emitter/n-doped O1
p*) p-doped O1/O2/O1:emitter/O1/n-doped O1
q) p-doped O1/O2/O1:emitter/O3/n-doped O1
r) p-doped O1/O1/O1:emitter/n-doped O1
s) p-doped O1/O1:emitter/O1/n-doped O1
t) p-doped O1/O1:emitter/n-doped O1

Furthermore, the emission layer can exist in the structures of the embodiment examples m) to t) even out of only one of the materials O1, O2 or O3:

m') p-doped O1/O1/O3/n-doped O2
m'') p-doped O1/O1/n-doped O2
n') p-doped O1/O3/O2/n-doped O2
n'') p-doped O1/O2/n-doped O2
o') p-doped O1/O1/O2/n-doped O1
p') p-doped O1/O2/O1/n-doped O1
q') p-doped O1/O2/O1/O3/n-doped O1
r'=s'=t') p-doped O1/O1/n-doped O1

All layer combinations listed above can be used in inverted and in non-inverted OLEDs, depending on the polarity of the base and cover electrode. The structures in the embodiment examples m) to t') all comprise only one emission layer from one single matrix material, therefore k=1 applies. By way of analogue, the simplifications named apply however also for the structures in the embodiment examples m) to q) and m') to q') for k=1, 2, 3 . . . . Particularly where white OLEDs are concerned, k is frequently larger than 1 as the white spectrum is made up of constituents of different colours.

The greatest challenge during the construction of an OLED with the same matrix for p- and n-doping is finding a matrix material that can be doped with a p- as well as with an n-dopant, so that it can be used in the hole and the electron transport layer. For the case that this material is also to be used as emitter or emitter host, its energy gap between HOMO and LUMO must be in a range that enables electrons and holes to penetrate the emission zone and to recombine there is a radiating manner. The explained details for the orbital levels of the matrix result direct from the considerations stated above according to the identity of the organic matrix materials O1 and O2. Phthalocyanine, for example ZnPc and CuPc, phorphyrine, for example ZnOEP, PtOEP or iridium (III) tris(1-phenylisoquinoline) are materials that have been used.

In the following, reference is made to the FIG. 2A to 2C. The most uncomplicated structure can be realised by a three-layer system which is shown above, for example, as embodiment r'). In principle, HOMO and LUMO levels match perfectly at every boundary surface if the same matrix material is involved on both sides of the boundary surface. That means that there is absolutely no energy barrier in such an OLED within the organic, neither for the electrons on their route through the LUMO nor for the holes on their route through the HOMO.

In order to obtain low operating voltages of the OLED, both charge carder transport layers are doped. This presupposes that the matrix material can be p-doped as well as n-doped. The balance of the two charge carrier types which must be balanced out for a high current efficiency can be set by way of the degree of the p- and n-doping.

The greatest advantage of this structure is its uncomplicated processing. In this case, however, charge carrier balance must be set. This can namely also depend on the applied voltage and, subsequently, on the brightness. A further parameter that has to be taken into account is the exciton diffusion length. If it is so large that the excitons can diffuse out of the emission zone, that will also reduce the efficiency.

As required, one (compare FIGS. 2B and 2C; embodiment examples o*), o'), p), p')) or even two (compare embodiment examples o), q), p*) and q')) block layers must be introduced, which restrict the holes and electrons in the emission layer. In this case, the energy difference of the LUMOs/HOMOs of the layer 3/3' and the emission layer 4 (compare FIG. 1) acts as a barrier for the electrons/holes with a non-inverted structure. This applies by analogy for an inverted structure. In this way, charge carriers are accumulated in the emission layer, a fact which again results in efficient light generation.

In OLED structures there are occasionally further layers that are introduced between the contacts and the layer structures described here. These layers can, for example, serve the improvement of the charge carrier injection or a better adhesion of the contact at the organic layers. It is understood that the described layer structures also concern such OLEDs, which include this type of layers additionally to the layer stack described here. This refers not only to coloured but also to white OLEDs.

Particularly attractive is the simplification according to the invention of the layer stack for the use in so-called "stacked" OLEDS. "Pin-stacked" OLEDs is normally understood to mean OLEDs with several pin-layer sequences on top of each other. These OLEDs enable high current efficiencies and the mixing of colours with the use of variously emitting emission stacks in the individual sub-pin-OLEDs. Particularly with these OLEDs which can consist of ten or more layers, the saving of each individual layer is a guarantee for higher production yield and more cost-favourable manufacture.

Full-colour displays with red, green and blue sub-pixels are a significant application for OLEDs. Pin-structures are used for this application also, where the attempt is made to deposit in a structured manner only the emission layer stack and/or the emission layer by means of a shadow mask in order to obtain the three differently coloured sub-pixels types. All other layers, meaning for example the transport and block layers, are to be jointly deposited for the three colours. However, this means for example that a block layer on the electron side can only then be dispensed with if the OLED simplified in this way functions equally well for all three colours. By means of the knowledge gained, the emitter matrixes can now be specifically selected in such a way that the same blocker can be dispensed with for all three colours. For example, one could select emitter matrixes for all three colours, which predominantly transport holes and subsequently, depending on the circumstances, dispense with the electron block layer.

In the following, and supplementary to the embodiments already described, other examples for the realisation of the simplified structures are described. Here, SAM was used as a p-dopant.

i) Example for a Structure According to the Embodiment c'

A red bottom-emitting OLED was processed on ITO with Spiro-TTB as organic matrix material for the hole transport layer and as electron block layer. On the electron side, a combination of non-doped and Cs-doped BPhen was implemented. A reflective aluminium cathode was deposited as a cover electrode. The emission layer consists of the emitter system NPD:Indium (III) to (2-methyldibenzo[f,h]-quinoxaline)(acetylacetonate). The characteristic data are shown in the FIGS. 3A and 3B. At only 2.6V, light with a brightness of 100 cd/m² and an efficiency of 6.6 lm/W is emitted.

ii) Example for a Structure According to the Embodiment a'

In contrast to the previous example, Spiro-TAD is applied here as a matrix for the hole transport layer, as intermediate layer 3 and as matrix for the emitter dye iridium (III) tris(1-phenylisoquinoline). All other layers were grown on by analogy with the previous example. The characteristic data are shown in the FIGS. 4A and 4B. The performance efficiency reaches 5.7 lm/W with a brightness of 100 cd/m² and an operating voltage of 3.7V.

iii) Example for a Structure According to the Embodiment n

A uniform transition on the electron side is realised with the help of a BPhen-matrix that is doped with Cs in order to ensure a high n-conductivity. BPhen is furthermore used as a hole block layer and as matrix material for the green-emitting emitter Ir(ppy)3. On the p-side and with SAM, p-doped Spiro-TTB was deposited on transparent ITO and onto this non-doped Spiro-TAD as electron block layer, restricting the electrons in the emission zone, was separated. The characteristic data were shown in the FIGS. 5A and 5B. Steep current-voltage characteristic curves were measured. 1000 cd/m² was obtained at an operating voltage of 2.75V and a performance efficiency of 22.2 lm/W.

iv) Example for an Individual Structure According to the Embodiments o'), p'), r'

The red-emitting material iridium (III) tris(1-phenylisoquinoline) is a suitable organic matrix material, which shows an increased conductivity with doping with acceptors as well as with donors. Three OLEDs based on this matrix material were built, namely a diode without block layers, a diode with MeT-TPD that was applied as an electron block layer (EB) and a diode in the 4,7-diphenyl-2,9-dicyano-1,10-phenanthroline(bathophenanthroline) as a hole block layer. Cs was used as an n-dopant. Characteristic data of these diodes are shown in the FIGS. 6 and 7. All samples show a good diode characteristic. The diode with EB emitted red light of a brightness of 100 cd/m² at 2.9 V. It is clearly evident that the luminance of the diodes is increased with the use of the block layers.

On the whole and with the described arrangements of organic layers, new configuration options with reference to the interaction between block layer and charge carrier transport layer and emission layer are created. Proceeding on the basis of simplified OLED structure, a method was furthermore created as to how OLEDs could be significantly and more easily processed. The point of initiation is the use of the same organic matrix material for several layers, for example as matrix material for the p-dopant, as electron blocker and as matrix material for the emission layer. For the manufacture of such layer arrangements, one or several evaporation sources for further matrix materials can be saved, which have to be vapour-deposited in known processes. In addition, it is enabled that the source for the matrix material can be continually operated. At first, a co-evaporation of the matrix with the p-dopant takes place (vapour deposition of the hole transport layer). Then the closure of the source of the p-dopant is closed and only the matrix is evaporated further (vapour deposition of the electron block layer). Then the closure for the emitter dye is opened and the emitter dye is co-evaporated together with the matrix material (vapour deposition of the emission layer). This procedure saves time for the heat-up and heat-down of the source for the matrix material and saves costs as well because only one source is used for the matrix material.

In summarising, the invention is based on the knowledge that the plurality of criteria that has to observed with the selection and the combination of organic matrix materials for the charge carrier transport, the charge carrier blockage and the light emission in organic pin-type light-emitting diodes does not necessarily lead to a situation where these matrix materials have to be different with regard to pairing. For example, one and the same organic matrix material, for example Spiro-TAD, can also be used as a matrix material for a hole transport layer in addition to its known use as block material, even though the criterion of doping capability and the criterion of the small barrier for the injection of holes into the omission layer are in opposition to one another. Here, new types of acceptors such as SAM, for example, are incorporated, which considerably expand the class of the p-dopable matrixes. In particular, materials, which were formerly used exclusively as block material can now also be used as p-doped hole transport material.

It was furthermore recognised that, in embodiments, the use of a block layer is dispensable for a charge carrier type, particularly if the mobility of this charge carrier type exceeds the mobility of the other charge carrier type in such a way that the emission zone is located far away on the opposite side of the emission layer. In this case it is also possible to select the same matrix material for the emission layer as for the transport layer of this highly mobile charge carrier type. For example, in the case of an emission layer comprising TCTA: Ir(ppy)3, an electron blocker consisting of Spiro-TAD for example can be dispensed with, even though in the state of the art such structures with Spiro-TAD or similar are stated at all times, for example in He et al.: Apply. Phys. Lett., 85 (17), 3911 (2004)). And in this case also, the emission layer and the hole transport layer can consist of the matrix material Spiro-TAD. This is surprising as the organic pin-type light-emitting diode as such has been known for more than ten years.

Furthermore, the knowledge was gained that it is possible in embodiments to use the one and the same material as matrix for the electron as well as the hole transport layer. Here, the conditions of doping capability for both charge carrier types, on the one hand, and the condition of the low barriers for charge carrier injection into the mission layer as welt as the condition of exclusion of the exciplex formation, on the other hand, are in opposition. It was recognised that acceptor and/or donor compounds can be selected, which are strong in order to ensure the charge carrier injection into a red radiating emission layer.

Despite the fact that with the described arrangements of organic layers, the entire structure of the OLED was significantly simplified, highly efficient structural elements are still being manufactured. The cause in this case is the uncomplicated injection of the charge carriers from the electrodes into the organic layer arrangement and the almost loss-free transport of the charge carriers through the transport layers based on the doping as well as the efficient recombination in the emission zone.

The features of the invention as disclose in the description given above, as well as in the drawing and the Claims can be of significance both individually as well as in random combination for the realisation of the invention is it various embodiments.

The invention claimed is:

1. Organic pin-type light-emitting diode comprising an electrode and a counter-electrode and a stack comprising organic layers between the electrode and the counter-electrode, wherein the stack comprising the organic layers comprises:
    an emission layer comprising k (k=1, 2, 3, . . . ) organic matrix materials;
    a doped charge carrier transport layer, which is arranged between the electrode and the emission layer;
    an additional doped charge carrier transport layer, which is arranged between the counter-electrode and the emission layer; and
    a block layer, which is arranged between the doped charge carrier transport layer and the emission layer; wherein the organic layers of the stack are formed by means of n (n≦k+2) organic matrix materials, n is the overall number of the matrix materials, the n organic matrix materials also comprise the k organic matrix materials of the emission layer, k is the number of the organic matrix materials used in the emission layer, and wherein the doped charged carrier transport layer or the additional doped charged carrier transport layer comprises at least one acceptor molecule stronger than F4-TCNQ.

2. Organic pin-type light-emitting diode according to claim 1, further comprising an additional block layer, which is arranged between the additional doped charge carrier transport layer and the emission layer.

3. Organic pin-type light-emitting diode according to claim 1, wherein the doped charge carrier transport layer and the block layer are made from a first of the n organic matrix materials.

4. Organic pin-type light-emitting diode according to claim 3, comprising an additional block layer, which is arranged between the additional doped charge carrier transport layer and the emission layer, wherein the additional block layer is made from the first of the n organic matrix materials, and wherein the organic pin-type light-emitting diode comprises at least one hole block layer and at least one electron block layer.

5. Organic pin-type light-emitting diode according to claim 4, wherein the emission layer includes at least one layer formed from the first of the n organic matrix materials, the at least one layer being adjacent to the block layer and/or to the additional block layer.

6. Organic pin-type light-emitting diode according to claim 3, wherein the additional doped charge carrier transport layer is made from a second of the n organic matrix materials.

7. Organic pin-type light-emitting diode according to claim 6, comprising an additional block layer, which is arranged between the additional doped charge carrier transport layer and the emission layer, wherein the additional block layer is made from the second of the n organic matrix materials wherein the organic pin-type light-emitting diode comprises at least one hole block layer and at least one electron block layer.

8. Organic pin-type light-emitting diode according to claim 7, wherein the emission layer includes at least one layer formed from the second of the n organic matrix materials, the at least one layer being adjacent to the additional block layer.

9. Organic pin-type light-emitting diode according to claim 1, wherein the doped charge carrier transport layer, the emission layer and the additional doped charge carrier transport layer are made from a first of the n organic matrix materials, and wherein the block layer is made from a second of the n organic matrix materials.

10. Organic pin-type light-emitting diode according to claim 9, comprising an additional block layer, which is arranged between the additional doped charge carrier transport layer and the emission layer, wherein the additional block layer is made from a third of the n organic matrix materials.

11. Organic pin-type light-emitting diode according to claim 10, wherein the emission layer includes at least one layer formed from the third of the n organic matrix materials and/or at least one layer formed from a fourth of the n organic matrix materials.

12. An organic pin-type light-emitting diode comprising an electrode and a counter-electrode and a block-layer-free stack comprising organic layers between the electrode and the counter-electrode, wherein the block-layer free stack comprises an emission layer, a doped charge carrier transport layer, which is arranged between the electrode and the emission layer, and an additional doped charge carrier transport layer, which is arranged between the counter-electrode and the emission layer, wherein the emission layer and the doped charge carrier transport layer of the block-layer-free stack are formed from one organic matrix material.

13. Organic pin-type light-emitting diode according to claim 12, wherein the additional doped charge carrier transport layer of the block-layer-free stack is formed from the one organic matrix material.

14. Organic pin-type light-emitting diode according to claim 13, wherein the block-layer free stack comprises an organic stack between electrode and counter-electrode, the organic stack being formed as a single organic matrix.

15. Organic pin-type light-emitting diode according to claim 1, wherein the doped charge carrier transport layer is formed from a first organic matrix material and comprises a p-dopant, and the additional doped charged carrier transport layer is formed from a second organic matrix material and comprises a n-dopant; wherein the doped charge carrier transport layer and the additional doped charged carrier transport layer are characterized by at least one of the following relations:

$$IP(O1) < EA(A) + 0.5 \text{ eV};$$

$$EA(O2) > IP(D) - 0.5 \text{ eV};$$

wherein IP(O1) is the ionization potential of the first organic matrix material; EA(A) is the electron affinity of the p-dopant; EA(O2) is the electron affinity of the second matrix material; and IP(D) is the ionization potential of the n-dopant.

16. Organic pin-type light-emitting diode according to claim 1, wherein the stack comprising organic layers comprises a molecule for doping selected from the group consisting of: quinones; oxidizing substances; $FeCl_3$; and 2-(6-dicyanomethylene-1,3,4,5,7,8-hexafluoro-6H-naphthalene-2-ylidene)-malononitrile.

17. Organic pin-type light-emitting diode according to claim 1, wherein the stack comprising organic layers comprises a dopant for n-type doping selected from the group consisting of: alkaline metals and alkaline earth metals.

18. Organic pin-type light-emitting diode with an electrode and a counter-electrode and a stack comprising organic layers between the electrode and the counter-electrode, wherein the stack comprising the organic layers comprises:

an emission layer, the emission layer comprising k (k=1, 2, 3, ... ) organic matrix materials;

a doped charge carrier transport layer, which is arranged between the electrode and the emission layer;

an additional doped charge carrier transport layer, which is arranged between the counter-electrode and the emission layer; and a block layer, which is arranged between the doped charge carrier transport layer and the emission layer;

wherein the organic layers of the stack are formed by means of n (n≦k+2) organic matrix materials, wherein n is the overall number of the matrix materials, the n organic matrix materials also comprises the k organic matrix materials of the emission layer, k is the number of the organic matrix materials used in the emission layer and the doped charge carrier transport layer, the block layer, and the additional doped charge carrier transport layer are made from a first of the n organic matrix materials.

19. Organic pin-type light-emitting diode comprising an electrode and a counter-electrode and a stack comprising organic layers between the electrode and the counter-electrode, wherein the stack comprising the organic layers comprises:

an emission layer, the emission layer comprising k (k=1, 2, 3, ... ) organic matrix materials;

a doped charge carrier transport layer, which is arranged between the electrode and the emission layer;

an additional doped charge carrier transport layer, which is arranged between the counter-electrode and the emission layer; and a block layer, which is arranged between the doped charge carrier transport layer and the emission layer;

wherein the organic layers of the stack are formed by means of n (n≦k+2) organic matrix materials, n is the overall number of the matrix materials, the n organic matrix materials also comprises the k organic matrix materials of the emission layer, k is the number of the organic matrix materials used in the emission layer, the doped charge carrier transport layer and the block layer are made from a first organic matrix material, and the additional doped charge carrier transport layer and the additional block layer are made from a second of the n organic matrix materials.

20. Organic pin-type light-emitting diode comprising an electrode and a counter-electrode and a stack comprising organic layers between the electrode and the counter electrode, wherein the stack comprising the organic layers comprises:

an emission layer comprising k (k=1, 2, 3, ... ) organic matrix materials;

a doped charge carrier transport layer, which is arranged between the electrode and the emission layer;

an additional doped charge carrier transport layer, which is arranged between the counter-electrode and the emission layer;

a block layer, which is arranged between the doped charge carrier transport layer and the emission layer; wherein the organic layers of the stack are formed by means of n (n≦k+2) organic matrix materials, n is the overall number of the matrix materials, the n organic matrix materials also comprise the k organic matrix materials of the emission layer, k is the number of the organic matrix materials used in the emission layer; and wherein the doped charge carrier transport layer is formed from a first organic matrix material and comprises a p-dopant, and the additional doped charged carrier transport layer is formed from a second organic matrix material and comprises a n-dopant; wherein the doped charge carrier transport layer and the additional doped charged carrier transport layer are characterized by at least one of the following relations:

$$IP(O1) < EA(A) + 0.5 \text{ eV};$$

$$EA(O2) > IP(D) - 0.5 \text{ eV}; \text{ or}$$

when cesium is a dopant, $EA(O2) > 1.9$ Ev;

wherein IP(O1) is the ionization potential of the first organic matrix material; EA(A) is the electron affinity of the p-dopant; EA(O2) is the electron affinity of the second matrix material; and IP(D) is the ionization potential of the n-dopant.

21. Organic pin-type light-emitting diode comprising an electrode and a counter-electrode and a stack comprising organic layers between the electrode and the counter-electrode, wherein the stack comprising the organic layers comprises:

- an emission layer comprising k (k=1, 2, 3, . . . ) organic matrix materials;
- a doped charge carrier transport layer, which is arranged between the electrode and the emission layer;
- an additional doped charge carrier transport layer, which is arranged between the counter-electrode and the emission layer;
- a block layer, which is arranged between the doped charge carrier transport layer and the emission layer; wherein the organic layers of the stack are formed by means of n ($n \leq k+2$) organic matrix materials, n is the overall number of the matrix materials, the n organic matrix materials also comprise the k organic matrix materials of the emission layer, k is the number of the organic matrix materials used in the emission layer; and
- wherein the doped charge carrier transport layer is formed from a first organic matrix material and comprises a n-dopant, and the additional doped charged carrier transport layer is formed from a second organic matrix material and comprises a p-dopant; wherein the doped charge carrier transport layer and the additional doped charged carrier transport layer are characterized by at least one of the following relations:

$$IP(O2) < EA(A) + 0.5 \text{ eV};$$

$$EA(O1) > IP(D) - 0.5 \text{ eV}; \text{ or}$$

when cesium is a dopant, $EA(O1) > 1.9$ eV;

wherein IP(O1) is the ionization potential of the first organic matrix material; EA(A) is the electron affinity of the p-dopant; EA(O2) is the electron affinity of the second matrix material; and IP(D) is the ionization potential of the n-dopant.

* * * * *